United States Patent
Chandra et al.

(10) Patent No.: US 12,066,490 B2
(45) Date of Patent: Aug. 20, 2024

(54) WRAPPER CELL DESIGN AND BUILT-IN SELF-TEST ARCHITECTURE FOR 3DIC TEST AND DIAGNOSIS

(71) Applicant: Taiwan Semiconductor Manufacturing Company, Ltd., Hsinchu (TW)

(72) Inventors: Anshuman Chandra, Hsinchu (TW); Sandeep Kumar Goel, Dublin, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 27 days.

(21) Appl. No.: 17/893,236

(22) Filed: Aug. 23, 2022

(65) Prior Publication Data

US 2023/0366930 A1     Nov. 16, 2023

Related U.S. Application Data

(60) Provisional application No. 63/342,196, filed on May 16, 2022.

(51) Int. Cl.
*G01R 31/3185*     (2006.01)
*G01R 31/3187*     (2006.01)

(52) U.S. Cl.
CPC ............ *G01R 31/318572* (2013.01); *G01R 31/318536* (2013.01); *G01R 31/318547* (2013.01); *G01R 31/318555* (2013.01); *G01R 31/3187* (2013.01)

(58) Field of Classification Search
CPC .... G01R 31/318572; G01R 31/318536; G01R 31/318547; G01R 31/318555; G01R 31/3187
See application file for complete search history.

(56) References Cited

U.S. PATENT DOCUMENTS 6,285,211 B1 *   9/2001   Sample ............ H03K 19/17744
                                                          326/39
7,219,281 B2 *   5/2007   Dubey ........... G01R 31/318541
                                                          714/727

(Continued)

FOREIGN PATENT DOCUMENTS

TW           202217346        5/2022

OTHER PUBLICATIONS

S. Vemula and C. Stroud, "Built-in self-test for programmable I/O buffers in FPGAs and SoCs," 2006 Proceeding of the Thirty-Eighth Southeastern Symposium on System Theory, Cookeville, TN, USA, 2006, pp. 534-538 (Year: 2006).*

(Continued)

*Primary Examiner* — Cynthia Britt
(74) *Attorney, Agent, or Firm* — Jones Day

(57) ABSTRACT

Systems, methods, and devices are described herein for performing intra-die and inter-die tests of one or more dies of an integrated circuit. A cell of an integrated circuit includes a data register, an I/O pad, and a first multiplexer. The data register is configured to output a signal. The I/O pad is coupled to the data register and configured to receive and buffer the signal. The first multiplexer is coupled to the I/O pad and the data register. The multiplexer is configured to selectively output either the buffered signal or the signal based on whether a scan mode or a functional mode is enabled.

20 Claims, 20 Drawing Sheets

(56) References Cited

U.S. PATENT DOCUMENTS

| | | | |
|---|---|---|---|
| 7,653,849 B1 * | 1/2010 | Tabatabaei | G01R 31/318508 714/733 |
| 2008/0001616 A1 * | 1/2008 | Abraham | G01R 31/31858 324/762.02 |
| 2009/0132879 A1 * | 5/2009 | Gangappa | G01R 31/318572 714/E11.155 |

OTHER PUBLICATIONS

L. Chen, Z. Wen, Z. Zhang and W. Min, "A Novel BIST Approach for Testing Input/Output Buffers in SOCs," 2009 IEEE Circuits and Systems International Conference on Testing and Diagnosis, Chengdu, China, 2009, pp. 1-3 (Year: 2009).*

R. Wang, K. Chakrabarty and S. Bhawmik, "Built-in self-test for interposer-based 2.5D ICs," 2014 IEEE 32nd International Conference on Computer Design (ICCD), Seoul, Korea (South), 2014, pp. 181-188 (Year: 2014).*

1 Taiwan office action; Application No. 112108172; Dated Dec. 22, 2023.

* cited by examiner

FIG. 10A

| Test (Zone1) | Logic |
|---|---|
| 1002 — Internal scan | Test the internal die logic |

FIG. 10B

| Test (Zone2) | Die Interface |
|---|---|
| 1012 — Chain test | Chain shift |
| 1014 — DC Test | Shorts & opens |
| 1016 — AC Test | Timing failures |
| 1018 — Leakage Test | Cell leakage failures |

FIG. 10C

| Test (Zone3) | Die Interconnect |
|---|---|
| 1022 — Chain test | Chain shift |
| 1024 — DC Test | Shorts & opens |
| 1026 — AC Test | Timing failures |
| 1028 — Bridging Test | Inter wire bridges |
| 1029 — Burn-in | Stack level burn-in failures |

FIG. 10D

| Total tests/Die | Internal scan test | Die-level test | Stack-level test |
|---|---|---|---|
| 1032 — Die 910 | Zone 1 | Zone 2 | Zone 3 |
| 1034 — Die 920 | Zone 1 | Zone 2 | - |

WRAPPER CELL DESIGN AND BUILT-IN SELF-TEST ARCHITECTURE FOR 3DIC TEST AND DIAGNOSIS

PRIORITY CLAIM

This application claims priority to U.S. Provisional Application No. 63/342,196, filed May 16, 2022, the contents of which are incorporated herein by reference in its entirety.

BACKGROUND

Three-dimensional (3D) stacking of semiconductor chips have increasingly become popular as they provide a way to pack more functionality on a chip while reduce manufacturing costs. 3D integrated circuits (ICs) achieve this by packaging smaller heterogeneous designs in dies, which are stacked together and connected through interconnects on the order of thousands. Manufacturing of these stacked circuits (e.g., ED-SIC) can, however, be defect-prone. Testing of the ICs to identify manufacturing defects and ensure proper functionality can help determine whether a semiconductor chip is fault free. While integrity of these interconnects is important for the chip to function properly, 3D IC architectures may not include direct access to probing the internal structures.

BRIEF DESCRIPTION OF THE DRAWINGS

Aspects of the present disclosure are best understood from the following detailed description when read with the accompanying figures:

FIG. 10A is a table illustrating the zone 1 tests, including an internal scan test that tests the internal die logic, in accordance with various embodiments of the present disclosure.

FIG. 10B is a table illustrating the zone 2 tests in accordance with various embodiments of the present disclosure.

FIG. 10C is a table illustrating the zone 3 tests in accordance with various embodiments of the present disclosure.

FIG. 10D is a table 1030 illustrating the zone tests that apply to each die in accordance with various embodiments of the present disclosure.

DETAILED DESCRIPTION

Figure 1:
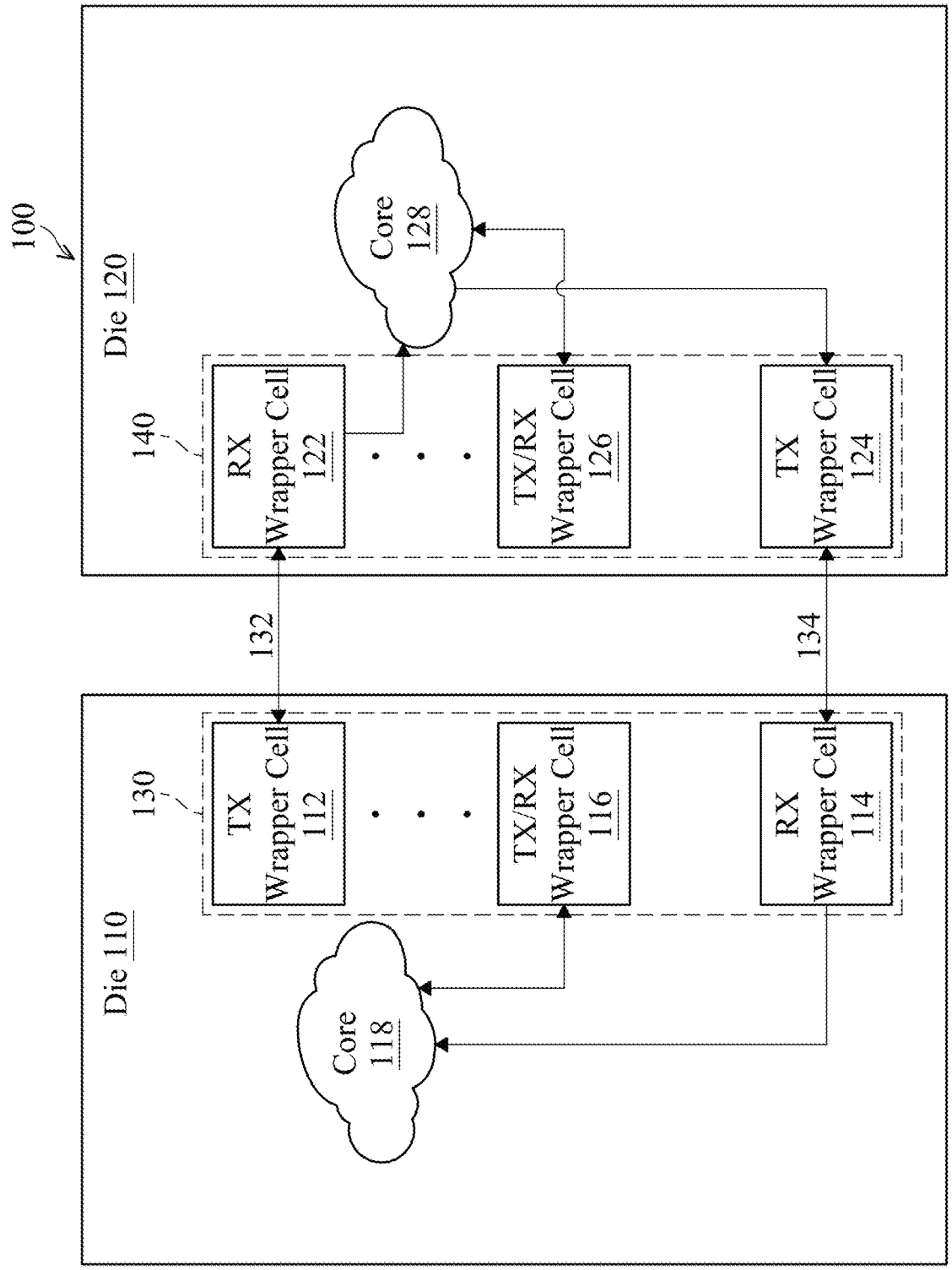
FIG. 1 is a block diagram illustrating an example built-in self-test (BIST) circuit having interconnected dies in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor wafer is fabricated to have a large number of integrated circuits (ICs). The semiconductor wafer is cut or diced into a number of smaller chips known as dies. Each die is a small block that includes an integrated circuit (IC). Each IC performs a particular electrical function. Multiple dies can be interconnected together via stacking in order to fabricate a semiconductor chip that can perform multiple functions. This is known as 3D chip stacking or 3D stacking of ICs (e.g., 3D-SIC).

In 3D chip stacking, two or more dies can be interconnected to facilitate transfer of electrical signals. These are known as inter-die interconnections. In other words, inter-die interconnections carry interconnect signals between two or more dies. 3D-SICs may contain thousands of interconnections. The inter-die interconnection manufacturing process, as well as the bonding process of dies are delicate and can be prone to defects that impact the electrical operation of the ICs, such as for example electrical opens, shorts, delay defects, or resistance issues. Common static fault models for interconnects are hard opens and shorts. These can be tested with static direct current (DC) test using wrappers.

The devices and methods described herein relate to a built-in self-test (BIST) architecture using a wrapper cell input/output (IO) loop back path that can quickly and reliably test, troubleshoot, and diagnose issues at die interfaces as well as issues with inter-die interconnections in 3D ICs. The BIST engine described herein provides a mechanism to obtain local and/or global failure data using local counters. Predefined sequences and on-chip signature comparators are used detect failures and identify the various types of defects or faults. More specifically, the BIST architecture described herein provides a mechanism to test each of the thousands of interconnections separately. Different pattern types can be run to help isolate a root cause of failures within the ICs.

FIG. 1 is a block diagram illustrating an example built-in self-test (BIST) circuit 100 having interconnected dies 110, 120 in accordance with various embodiments of the present disclosure. Built-in self-test circuit 100 includes dies 110, 120 that are interconnected together via inter-die interconnections 132, 134, respectively. Inter-die interconnections 132, 134 can represent, for example, inter-die interconnects of logic-to-logic, logic-to-memory, or memory to memory. More specifically, each die includes any number of uni-directional transmit (TX) wrapper cells, uni-directional receive (RX) wrapper cells, bi-directional (TX/RX) wrapper cells, and integrated circuitry in a core that includes functional logic or memory for example. For example, die 110 includes TX wrapper cell 112 (uni-directional), RX wrapper cell 114 (uni-directional), TX/RX wrapper cell 116 (bi-directional), and core 118. TX wrapper cell 112, RX wrapper cell 114, and TX/RX wrapper cell 116 are referred to as a chain 130. Similarly, die 120 includes RX wrapper cell 122 (uni-directional), TX wrapper cell 124 (uni-directional), TX/RX wrapper cell 126 (bi-directional), and core 128. RX wrapper cell 122, TX wrapper cell 124, and TX/RX wrapper cell 126 are referred to as a chain 140. TX wrapper cell 112 of die 110 is interconnected via a functional wire (e.g., inter-die interconnection 132) to RX wrapper cell 122 of die 120. Likewise, RX wrapper cell 114 of die 110 is interconnected via a functional wire (e.g., inter-die interconnection 134) to TX wrapper cell 124 of die 120. Each wrapper cell 112, 114, 122, 124 facilitates testing, troubleshooting, and diagnosis of uni-directional pads within each cell on the path from the cell to the die interface as part of an intra-die test. Additionally, the bi-directional pads of the bi-directional wrapper cells can be tested using loop back test at the die-level itself.

Figure 2:
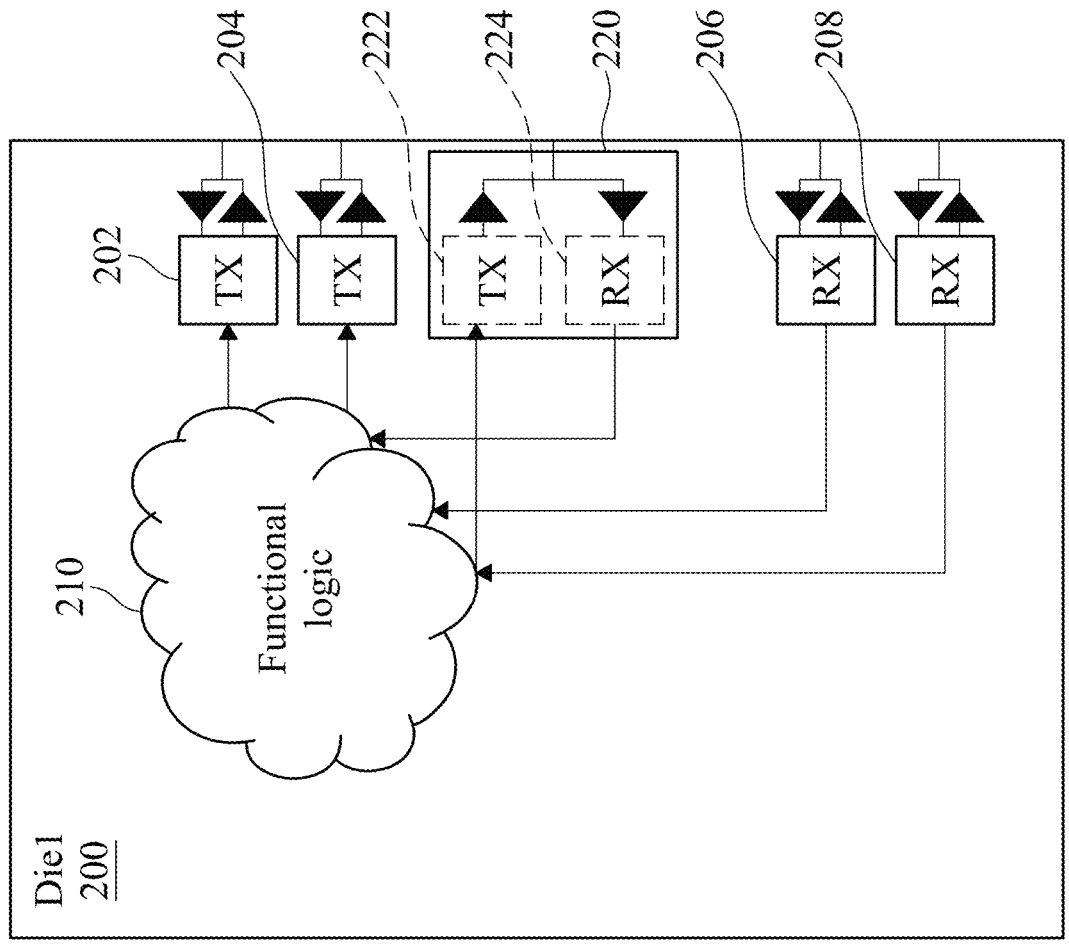
FIG. 2 is a block diagram illustrating an example die in accordance with various embodiments of the present disclosure.

FIG. 2 is a block diagram illustrating an example die 200 in accordance with various embodiments of the present disclosure. Die 200 include uni-directional TX wrapper cells 202, 204, uni-directional RX wrapper cells 206, 208, functional logic 210, and bi-directional wrapper cell 220. Bi-directional wrapper cell 220 includes a TX wrapper cell 222 and a RX wrapper cell 224. The uni-directional pad on the path from the cell to the die interface can be tested as part of intra-die test.

Figure 3:
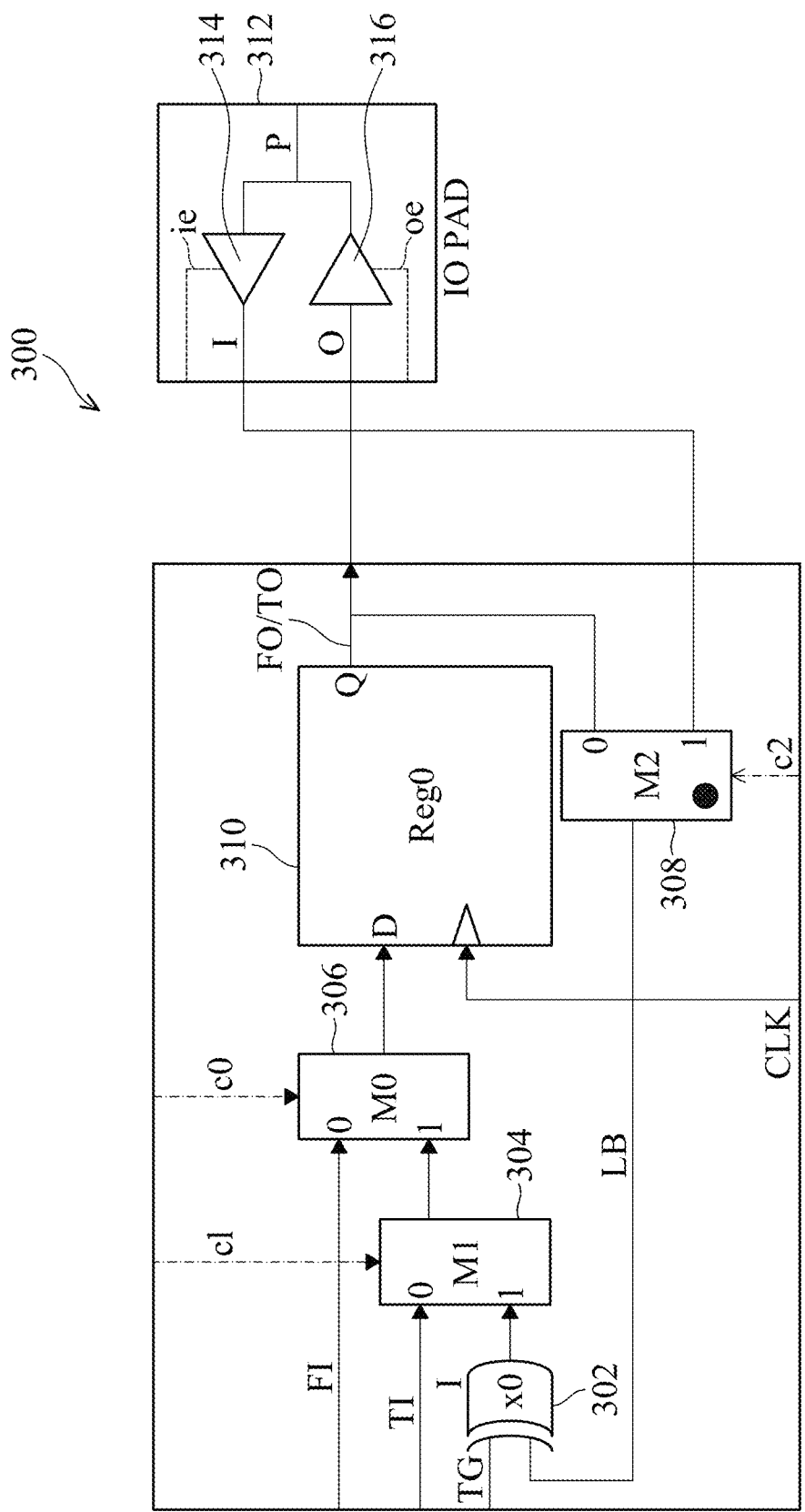
FIG. 3 is a block diagram illustrating an example wrapper cell with an intra-die loop back path in accordance with various embodiments of the present disclosure.

FIG. 3 is a block diagram illustrating an example wrapper cell 300 with an intra-die loop back path in accordance with various embodiments of the present disclosure. By way of example, wrapper cell 300 is a TX wrapper cell of a die (e.g., die 110, die 120, or die 200). Wrapper cell 300 includes a logic gate 302, multiplexers 304, 306, 308, a data register 310, and an input/output (IO) pad 312. Wrapper cell 300 provides hold, toggle, and IO wrap functionality. For example, logic gate 302 receives a toggle (TG) signal as well as a loop back (LB) signal output from multiplexer 308. The toggle (TG) signal determines whether to toggle or hold the data in wrapper cell 300. When the toggle (TG) signal is a logic high (e.g., '1'), wrapper cell 300 is in a data hold state. When the toggle (TG) signal is a logic low (e.g., '0'), wrapper cell 300 is in a data toggle state. The output of logic gate 302 is a logic high (e.g., '1') when the toggle (TG) signal and loop back (LB) signal are opposite of each other (e.g., one is a logic high '1' and the other is a logic low '0'). When the toggle (TG) signal and loop back (LB) signal are the same (e.g., both logic high '1' or both logic low '0'), the output of logic gate 302 is a logic low (e.g. '0'). By way of example, logic gate 302 is depicted as an XOR gate, but it can be appreciated that logic gate 302 can be any combination of logic gates that achieve the same logic function.

The output of logic gate 302 is coupled to an input of multiplexer 304. Multiplexer 304 also receives an input (TI) signal. Multiplexer 304 is controlled by a control (c1) signal. When the control (c1) signal is a logic low (e.g., '0'), multiplexer 304 scans in a signal received by wrapper cell 300 (e.g., the input (TI) signal). In other words, multiplexer 304 outputs the input (TI) signal. When the control (c1) signal is a logic high (e.g. '1'), multiplexer 304 loops back the signal output by data register 310 or IO pad 312. In other words, multiplexer 304 outputs the output of logic gate 302.

The output of multiplexer 304 is coupled to an input of multiplexer 306. Multiplexer 306 also receives a functional input (FI) signal. Multiplexer 306 determines whether wrapper cell 300 is in a functional mode or a scan mode. Multiplexer 306 is controlled by a control (c0) signal. When the control (c0) signal is a logic low (e.g., '0'), multiplexer 306 is in functional mode and outputs the functional input (FI) signal. When the select signal is a logic high (e.g., '1'), multiplexer 306 is in scan mode and outputs the output of multiplexer 304.

The output of multiplexer 306 is coupled to data register 310, which can be a flip-flop for example. Data register 310 also receives a clock (CLK) signal. The functional or toggle output (FO/TO) signal of data register 310 is looped back as an input to multiplexer 308. The functional or toggle output (FO/TO) signal is also provided to the I/O pad 312 in response to the wrapper cell 300 being in scan mode. I/O pad 312 is a bi-directional pad cell includes buffers 314, 316. Buffer 314 facilitates signal flow from input based on the logic sign of the input enable (ie) signal. Buffer 316 facilitates signal flow output based on the logic sign of the output enable (oe) signal. I/O pad 312 is an intermediate structure that connects signals from a core (e.g., core 118, 128, functional logic 210) to external pins of the die (not shown in FIG. 3). The output of buffer 314 is coupled to an input of multiplexer 308. Multiplexer 308 provides a loop back (LB) signal to logic gate 302 based on control (c2) signal. When control (c2) signal is a logic low (e.g., '0'), the loop back (LB) signal output by multiplexer 308 is functional or toggle output (FO/TO) signal from data register 310. When control (c2) signal is a logic high (e.g., '1'), the loop back (LB) signal output by multiplexer 308 is input (I) signal provided by buffer 314 of IO pad 312.

Wrapper cell 300 includes an intra-die loop back path by way of IO pad 312 and multiplexer 308. The intra-die loop back path directs a test pattern (e.g., functional or toggle output (FO/TO) signal) back to data register 310 through multiplexer 308.

Figure 4:
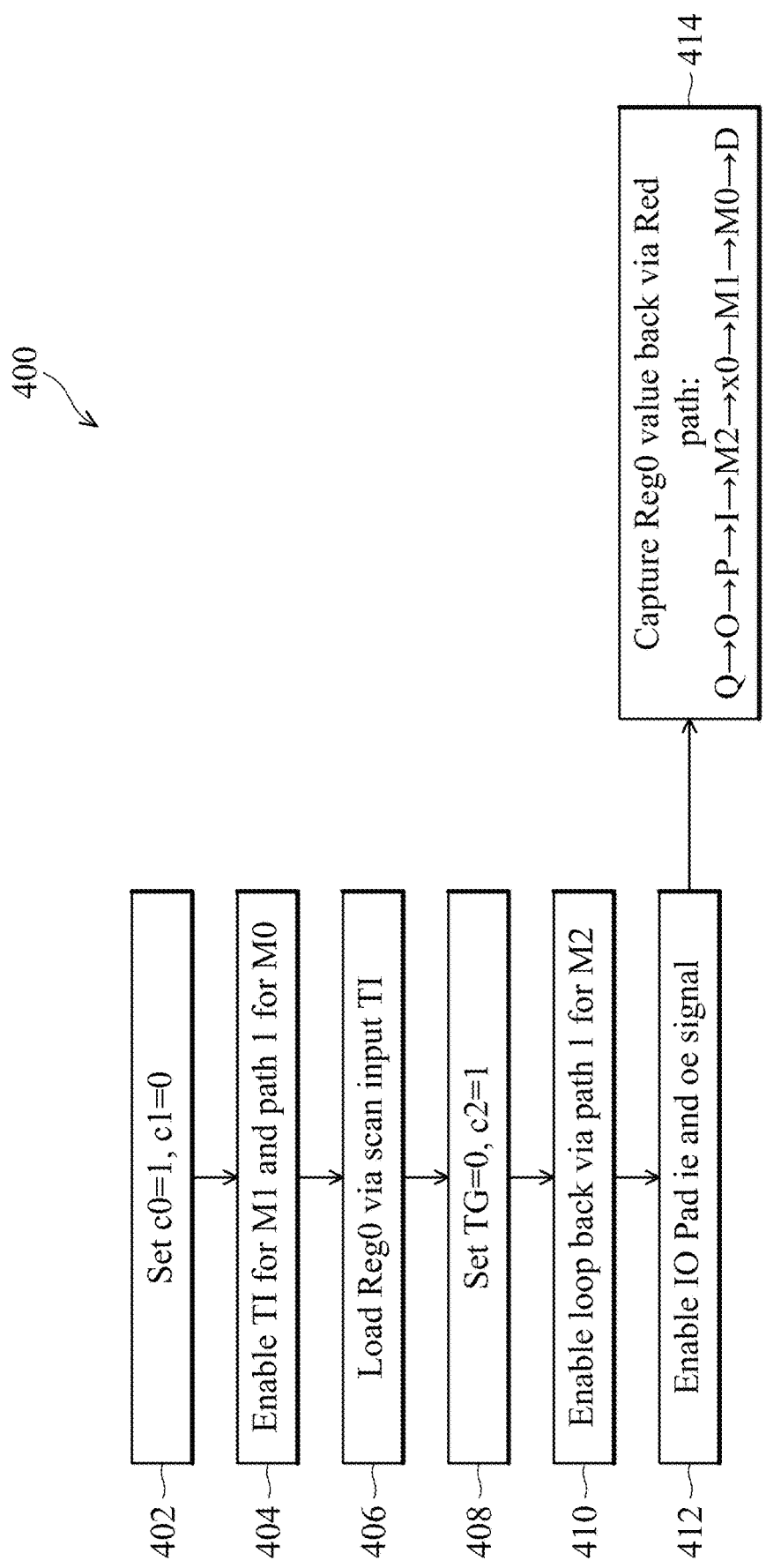
FIG. 4 is a process flow diagram illustrating the enabling of the scan mode and intra-die loop back path of wrapper cell in FIG. 3 in accordance with various embodiments of the present disclosure.

FIG. 4 is a process flow diagram 400 illustrating the enabling of the scan mode and intra-die loop back path of wrapper cell 300 in FIG. 3 in accordance with various embodiments of the present disclosure. At step 402, wrapper cell 300 is put into scan mode by the setting of control (c0) signal to a logic high (e.g., '1') and enabling a scan in by the setting of control (c1) signal to a logic low (e.g., '0'). At step 404, with control (c1) signal at a logic low (e.g., '0'), multiplexer 304 outputs the input (TI) signal. This input (TI) signal is then output by multiplexer 306 due to the setting of control (c0) as a logic high (e.g., '1'). In turn, at step 406, this input (TI) signal is loaded into data register 310. At step 408, the toggle (TG) signal is set to a logic low (e.g., '0') and the control (c2) signal is set to a logic high (e.g., '1'). At step 410, multiplexer 308 outputs a loop back (LB) path signal that is the input (I) signal from buffer 314 of IO pad 312 based on the control (c2) signal set to a logic high (e.g. '1'). At step 412, the input (I) signal is enabled through setting both the input enable (ie) signal of buffer 314 and output enable (oe) signal of buffer 316 to logic highs (e.g. '1'). This allows the signals to flow through IO pad 312. At step 414, since the loop back path is enabled, data from the data register 310 can be captured. In other words, the signal flow is as follows: Q output from data register 310 is provide to O input to buffer 316, P output from buffer 316 is provided to buffer 314, buffer 314 outputs I to multiplexer 308, multiplexer 308 outputs I to logic gate 302, with the toggle (TG) signal being different from I, it outputs a logic low (e.g., '0') to multiplexer 304, multiplexer 304 outputs the input (TI) signal based on the control (c1) signal set to a logic low (e.g., '0'), and multiplexer 306 outputs that input (TI) signal to a data pin (D) of data register 310.

Figure 5:
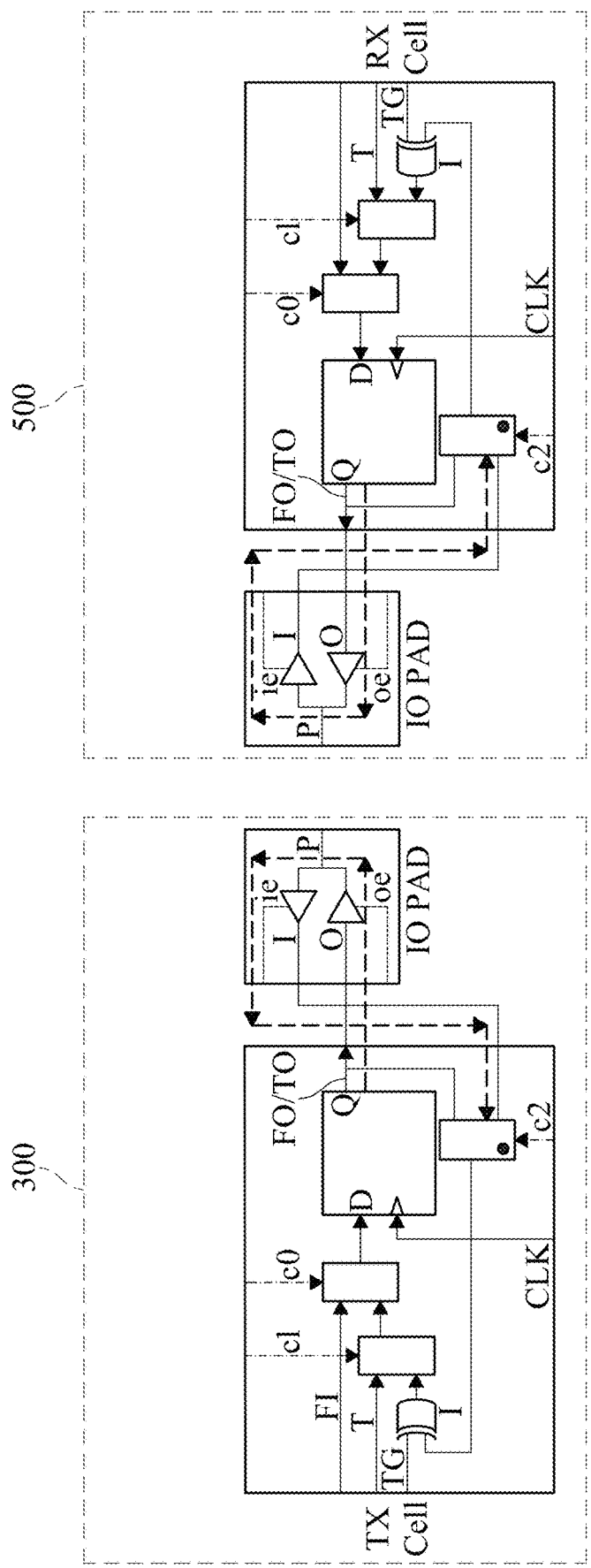
FIG. 5 is a block diagram illustrating example intra-die loop back paths within two wrapper cells in accordance with various embodiments of the present disclosure.

FIG. 5 is a block diagram illustrating example intra-die loop back paths within two wrapper cells 300, 500 in accordance with various embodiments of the present disclosure. As illustrated, each wrapper cell 300, 500 has its own intra-die loop back path. By way of example, wrapper cell 300 is a TX wrapper cell and wrapper cell 500 is a RX wrapper cell. Wrapper cell 500 contains the same components and functionality for its intra-die loop back path as wrapper cell 300 described in FIGS. 3-4. Wrapper cells 300, 500 can be of the same die (e.g., die 110, die 120, or die 200) such as TX wrapper cell 202 and RX wrapper cell 206, respectively or TX wrapper cell 222 and RX wrapper cell 224, respectively, of bi-directional wrapper cell 220. Alternatively, wrapper cells 300, 500 can be of different dies (e.g., one of die 110, die 120, or die 200 and another of die 110, die 120, or die 200).

Figure 6:
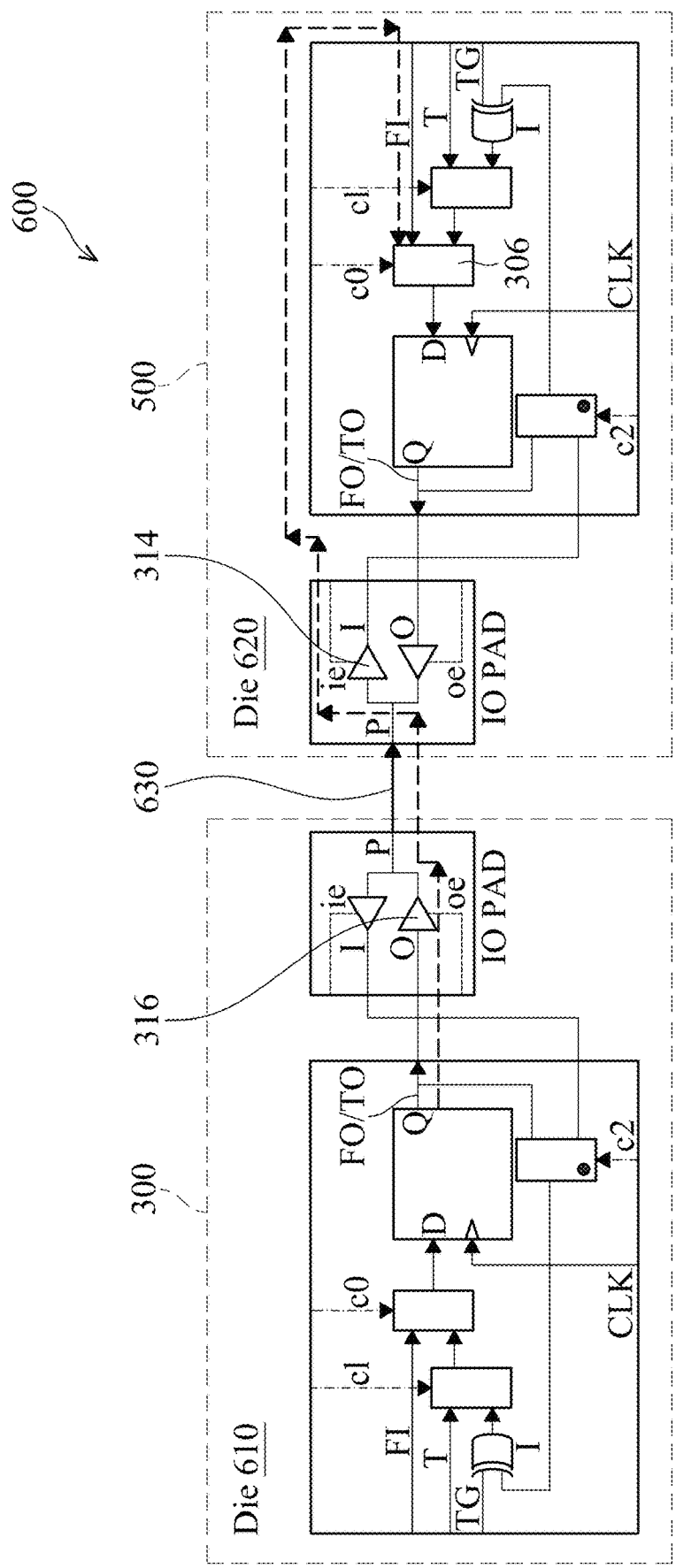
FIG. 6 is a block diagram illustrating example an die interconnection sub-system having inter-die interconnects between wrapper cell of die and wrapper cell of die in accordance with various embodiments of the present disclosure.

FIG. 6 is a block diagram illustrating example an die interconnection sub-system 600 having inter-die interconnects between wrapper cell 300 of die 610 and wrapper cell 500 of die 620 in accordance with various embodiments of the present disclosure. By way of example, wrapper cell 300 of die 610 and wrapper cell 500 of die 620 can be equivalent to TX wrapper cell 112 of die 110 and RX wrapper cell 122 of die 120, respectively. Wrapper cells 300, 500 are interconnected via inter-die interconnection 630 (e.g., inter-die interconnection 132, 134). The components and functionality of the loop back paths in each of wrapper cell 300, 500 are as described in FIGS. 3-4. The difference between die interconnection subsystem 600 and the intra-die loop back paths described in FIGS. 3-4 is that the output (P) signal from buffer 316 of die 610 is provided to an input (I) to buffer 314 of die 620. The output of buffer 314 of die 620 is then provided as the input (FI) signal to multiplexer 306.

Figure 7:
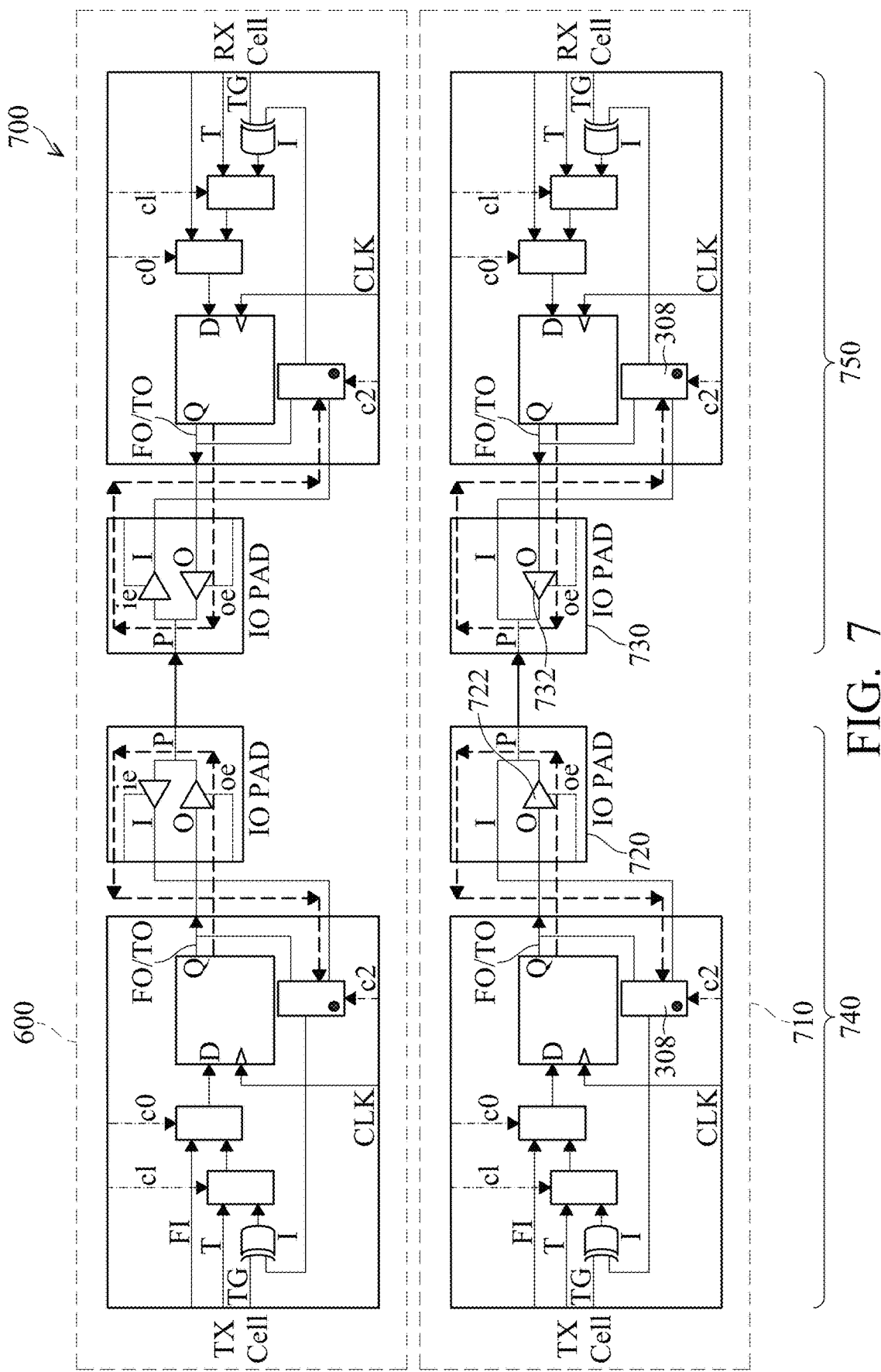
FIG. 7 is a block diagram illustrating an interconnected die system having two dies with inter-die interconnections in accordance with various embodiments of the present disclosure.

FIG. 7 is a block diagram illustrating an interconnected die system 700 having two dies 740, 750 with inter-die interconnections in accordance with various embodiments of the present disclosure. An interconnected die system 700 includes die interconnection sub-systems 600, 710. Die interconnection sub-system 710 is similar to die interconnection subsystem 600 in functionality and components, except that each IO pad has a single buffer, rather than two buffers. For example, IO pad 720 of die 740 includes buffer 722. Similarly, IO pad 730 of die 750 includes buffer 732. Buffer 720 provides an output (I) signal that is provided to multiplexer 308 of die 740. This same output (I) signal coupled to the output (I) of buffer 732. This output (I) is provided to multiplexer 308 of die 750.

Figures 8A, 8B:
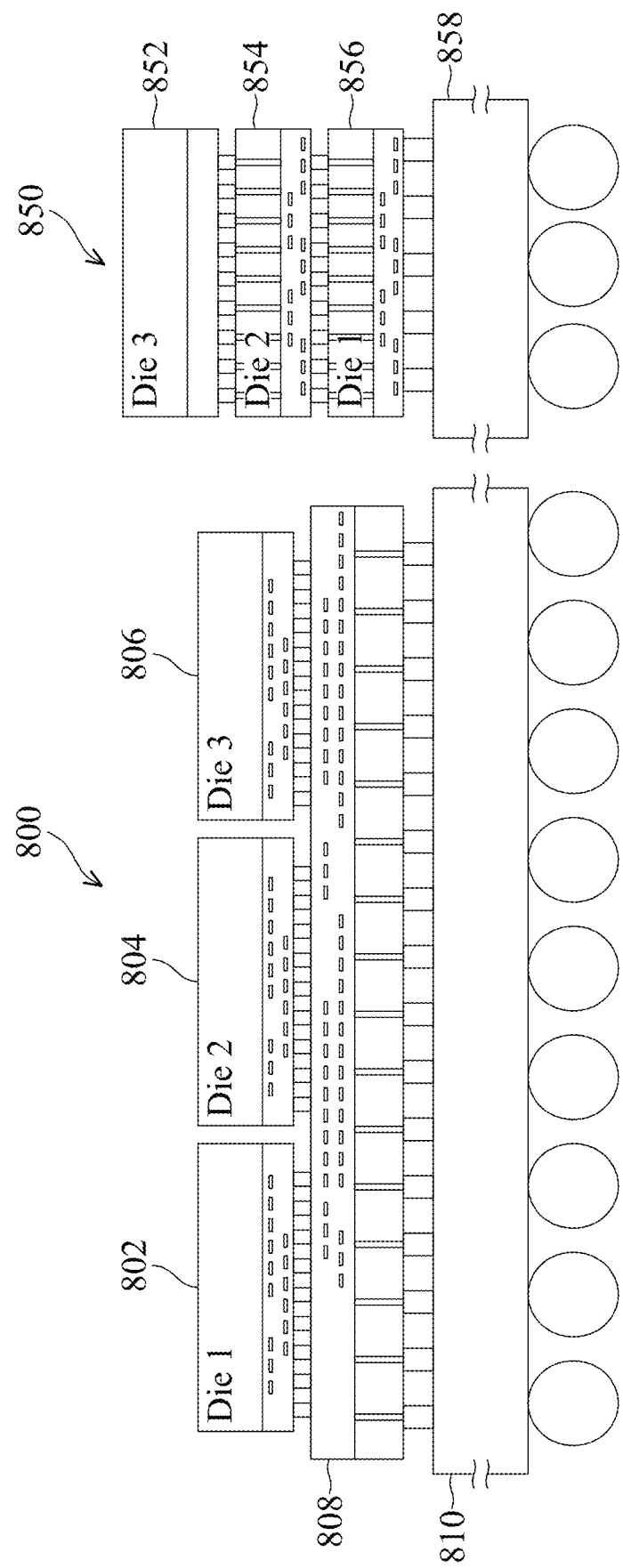
FIG. 8A is block diagram illustrating an example 3D die stack with horizontally integrated dies in accordance with various embodiments of the present disclosure.
FIG. 8B is a block diagram illustrating another example 3D die stack with vertically integrated dies in accordance with various embodiments of the present disclosure.

FIG. 8A is block diagram illustrating an example 3D die stack 800 with horizontally integrated dies in accordance with various embodiments of the present disclosure. 3D die stack 800 includes a number of dies (e.g., chips or ICs) 802, 804, 806 coupled to a substrate 810 that are electrically interconnected via IO pads (not shown) as described in FIGS. 6-7 and operate as described in FIGS. 3-4 and 6-8. Interposer 808 can be used as an electrical interface between dies 802, 804, 806 by means of functional wires, for example, in the interposer 808. In another example, FIG. 8B is a block diagram illustrating another example 3D die stack 850 with vertically integrated dies in accordance with various embodiments of the present disclosure. For example, the 3D die stack 850 includes a number of dies (e.g., chips or ICs) 852, 854, 856 coupled to substrate 858 that are electrically interconnected via IO pads (not shown) as described in FIGS. 6-7 and operate as described in FIGS. 3-4 and 6-8. In the context of the present disclosure, a functional wire is a wire, e.g. a metal interconnect, which is part of the functional design of stack, and which is not dedicatedly added for test purposes.

Figure 9A:
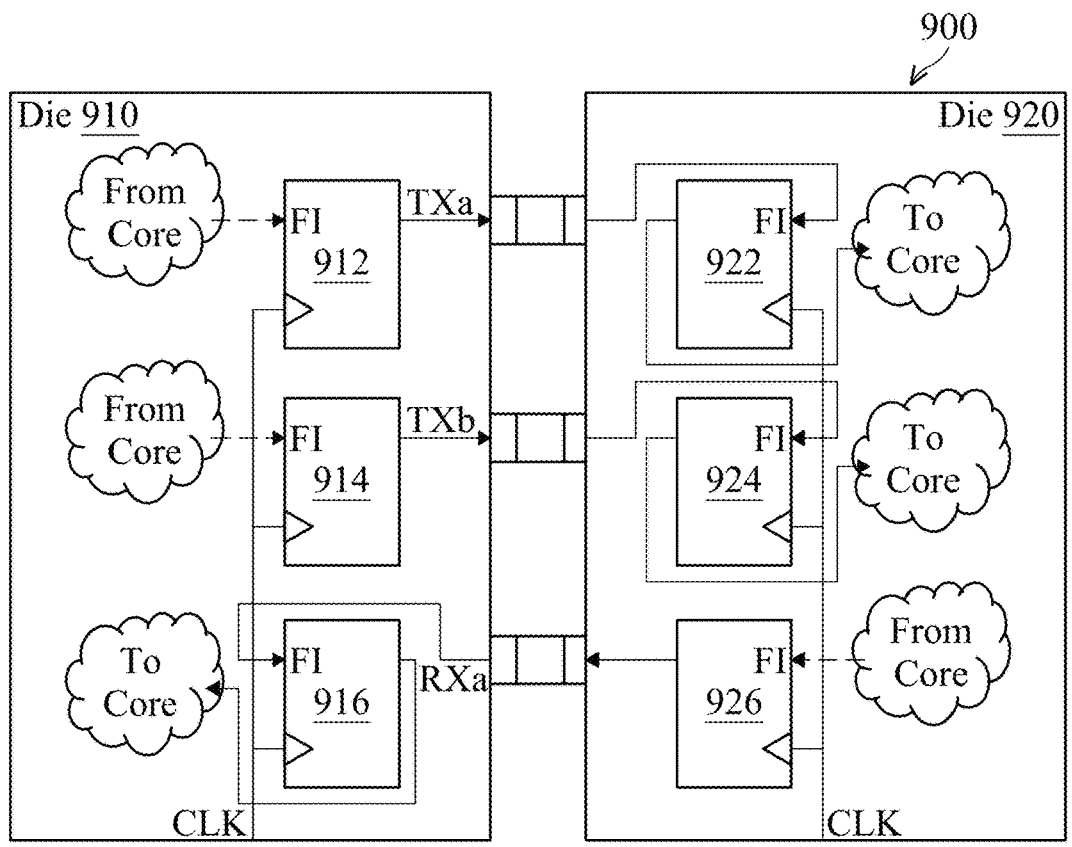
FIG. 9A is a block diagram illustrating an interconnected die system having two dies in accordance with various embodiments of the present disclosure.
Figure 9B:
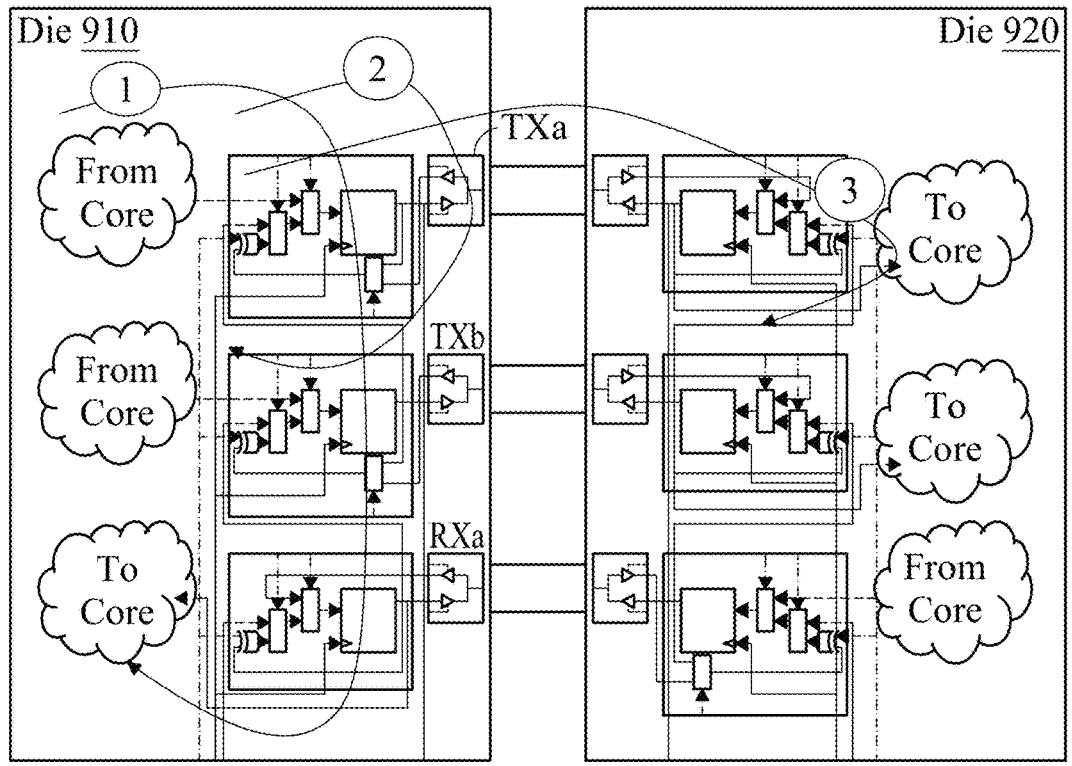
FIG. 9B is a block diagram illustrating testing zones of the interconnected die system in accordance with various embodiments of the present disclosure.

Using the structures described in FIGS. 1-8, dies can be scanned and tested. FIGS. 9A-9B are block diagrams illustrating zoning of dies under test in accordance with various embodiments of the present disclosure. More specifically, FIG. 9A is a block diagram illustrating an interconnected die system 900 having two dies 910, 920 in accordance with various embodiments of the present disclosure. Die 910 includes TX wrapper cells 912, 914 and RX wrapper cell 916. Die 920 includes TX wrapper cell 926 and RX wrapper cells 924,922. TX wrapper cell 912 is interconnected with RX wrapper cell 922. TX wrapper cell 914 is interconnected with RX wrapper cell 924. RX wrapper cell 916 is interconnected with TX wrapper cell 926. FIG. 9B is a block diagram illustrating testing zones of the interconnected die system 900 in accordance with various embodiments of the present disclosure. Zone 1 represents internal die tests of die internal logic of die 910 that tests TX wrapper cells 912, 914 and RX wrapper cell 916. Zone 2 represents die level tests of the interface between die 910 and die 920. Although zone 1 is illustrated with respect to die 910, it can be appreciated that this zone can be internal to any die, including die 920. The IO pad associated with TX wrapper cell 912 is used to test the interface. Zone 3 represents stack level tests of the interconnection between die 910 and die 920 using the loop back path described in FIG. 6. The zone 1 and zone 2 tests can be used to confirm a Known Good Die (KGD) signal flow. The zone 3 tests can be used to confirm a Known Good Stack (KGS) signal flow.

FIGS. 10A-10D are a series of tables illustrating various tests for each zone described in FIG. 9B. For example, FIG. 10A is a table 1000 illustrating the zone 1 tests, including an internal scan test 1002 that tests the internal die logic, in accordance with various embodiments of the present disclosure. Specific test pattern sequences for each of the tests in the zones are described in detail in FIG. 11.

FIG. 10B is a table 1010 illustrating the zone 2 tests in accordance with various embodiments of the present disclosure. The zone 2 tests include a chain test 1012, a direct current (DC) test 1014, an alternating current (AC) test 1016, and a leakage test 1018. The chain test 1012 tests the chain shift of the circuitry within the die. The DC test 1014 tests for shorts and/or opens of the circuitry within the die. The AC test 1016 tests for timing failures of the circuitry within the die. The leakage test 1018 tests for cell leakage failures within the die.

FIG. 10C is a table 1020 illustrating the zone 3 tests in accordance with various embodiments of the present disclosure. The zone 3 tests include a chain test 1022, a DC test 1024, an AC test 1026, a bridging test 1028, and a burn-in test 1029. The chain test 1022 tests the chain shift of the circuitry between two dies. The DC test 1024 tests the chain shift of the circuitry between two dies. The AC test 1026 tests for timing failures of the circuitry between two dies. The bridging test 1028 tests inter-wire bridges between two dies. The burn-in test 1029 tests for stack level burn-in failures.

FIG. 10D is a table 1030 illustrating the zone tests that apply to each die 910, 920 in accordance with various embodiments of the present disclosure. For example, the zone 1, zone 2, and zone 3 tests apply to die 910 (e.g., total die 910 tests 1032). The zone 1 and zone 2 tests apply to die 920 (e.g., total die 920 tests 1034).

Figure 11:
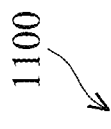
FIG. 11 is a table illustrating the test patterns for each zone test described in FIGS. 10A-10B in accordance with various embodiments of the present disclosure.

FIG. 11 is a table 1100 illustrating the test patterns for each zone test described in FIGS. 10A-10B in accordance with various embodiments of the present disclosure. The internal scan test 1102 tests the internal logic of a die using an automatic test pattern generation (ATPG) pattern. The internal scan test 1102 applies to zone 1. The chain test 1104 tests the wrapper chain shift functionality using a chain pattern. The chain pattern shifts a sequence (e.g., '00110011') through the entire scan chain without exercising the functional circuitry. The chain test 1104 applies to zone 2. The DC test 1106 tests for logic signals stuck at either shorts (shown by a stuck logic high '1') and opens (shown by a stuck logic low '0') using a pattern of all logic lows (e.g., '000000 . . . ') or all logic highs (e.g., '111111 . . . '). The DC test 1106 applies to zone 1 and zone 2. The AC test 1108 tests of transitions from a logic low (e.g., '0') to a logic high (e.g., '1') or a logic high (e.g., '1') to a logic low (e.g., '0') using a pattern of all logic lows (e.g., '000000 . . . ') or all logic highs (e.g., '111111 . . . '). The AC test 1108 utilizes the logic gate 302 and applies to zone 1 and zone 2. The leakage test 1110 tests for cell value changing due to leakage using a pattern of alternating logic values (e.g., 0101010 . . . 01 or 1010101 . . . 10). The leakage test 1110 applies to zone 1. The bridging test 1112 tests for inter-wire bridges using any of the following patterns: 11110000, 11100001, . . . , 00001111. The bridging test 1112 applies to zone 2. The burn-in test 1114 tests for failure during burn-in using a pattern of alternating logic signals (e.g., 0101 . . . 010). The burn-in test 1114 applies to zone 2. The burn-in test 1114 is run for an extended period time to ensure the durability of the die.

Figure 12:
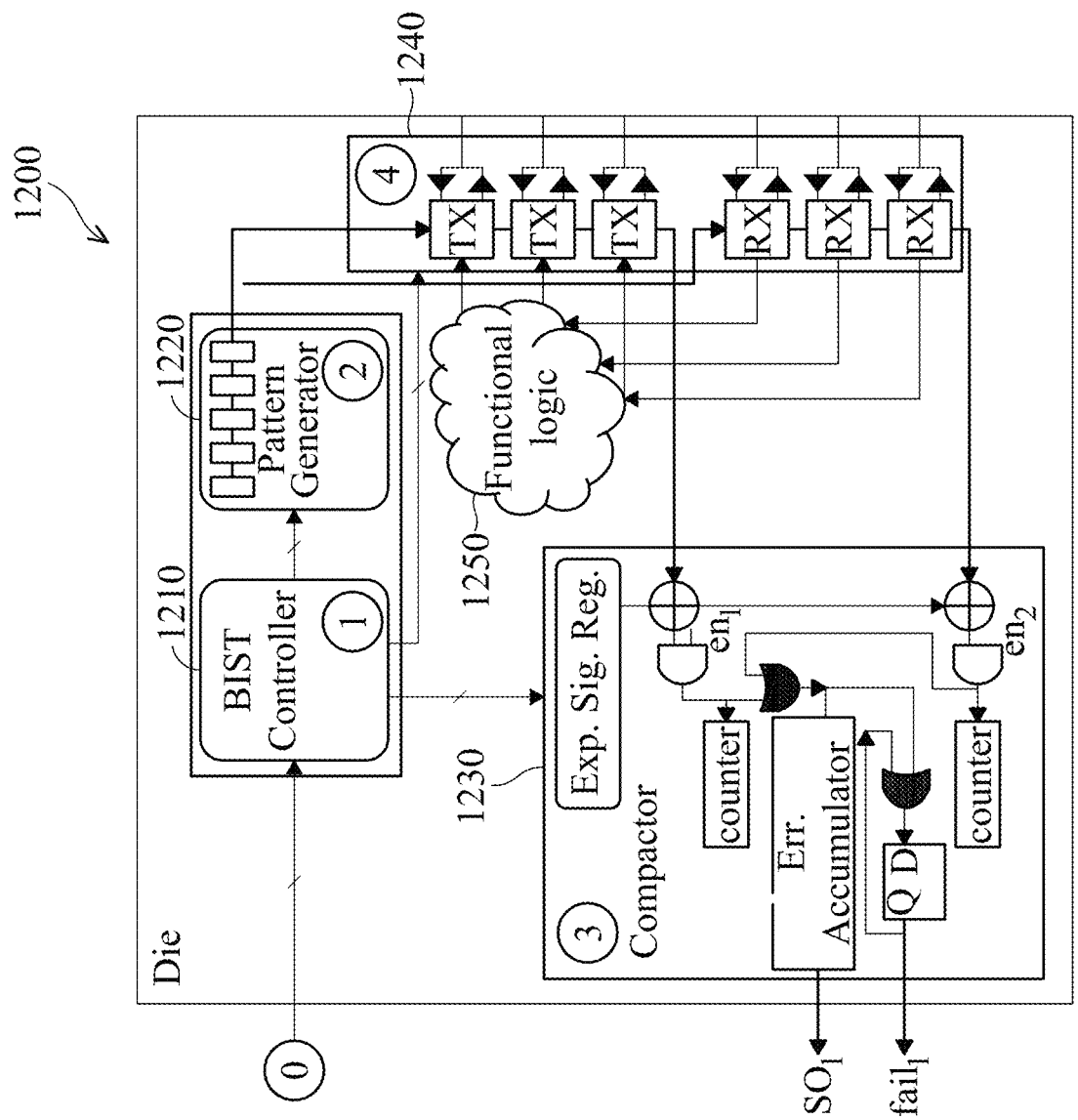
FIG. 12 is a block diagram illustrating functional components of a die with BIST functionality in accordance with various embodiments of the present disclosure.

FIG. 12 is a block diagram illustrating functional components of a die 1200 with BIST functionality in accordance with various embodiments of the present disclosure. Die 1200 includes a BIST controller 1210, a pattern generator 1220, a response compactor 1230, a chain of wrapper cells 1240, and core 1250 (e.g., functional logic). Each of these components are described in detail in FIGS. 13-16. BIST controller 1210 controls the overall test session for inter-die and/or intra-die tests. Pattern generator 1220 generates the pre-defined test pattern sequences such as for the open, shorts, bridges and timing faults associated with the DC test 1106 (e.g., DC tests 1014, 1024), AC test 1108 (e.g., AC tests 1016, 1026), and bridging test 1112 (e.g., bridging test 1028). The response compactor 1230 receives responses to test patterns from the wrapper cells and generates the data for analyzing yield and fault diagnosis. The chain of wrapper cells 1240 (e.g., wrapper cells described in FIGS. 1-3, 5-7, and 9) under test receive the test patterns generated by pattern generator 1220 and generate responses for the various tests described in FIGS. 10A-11.

Figure 13:
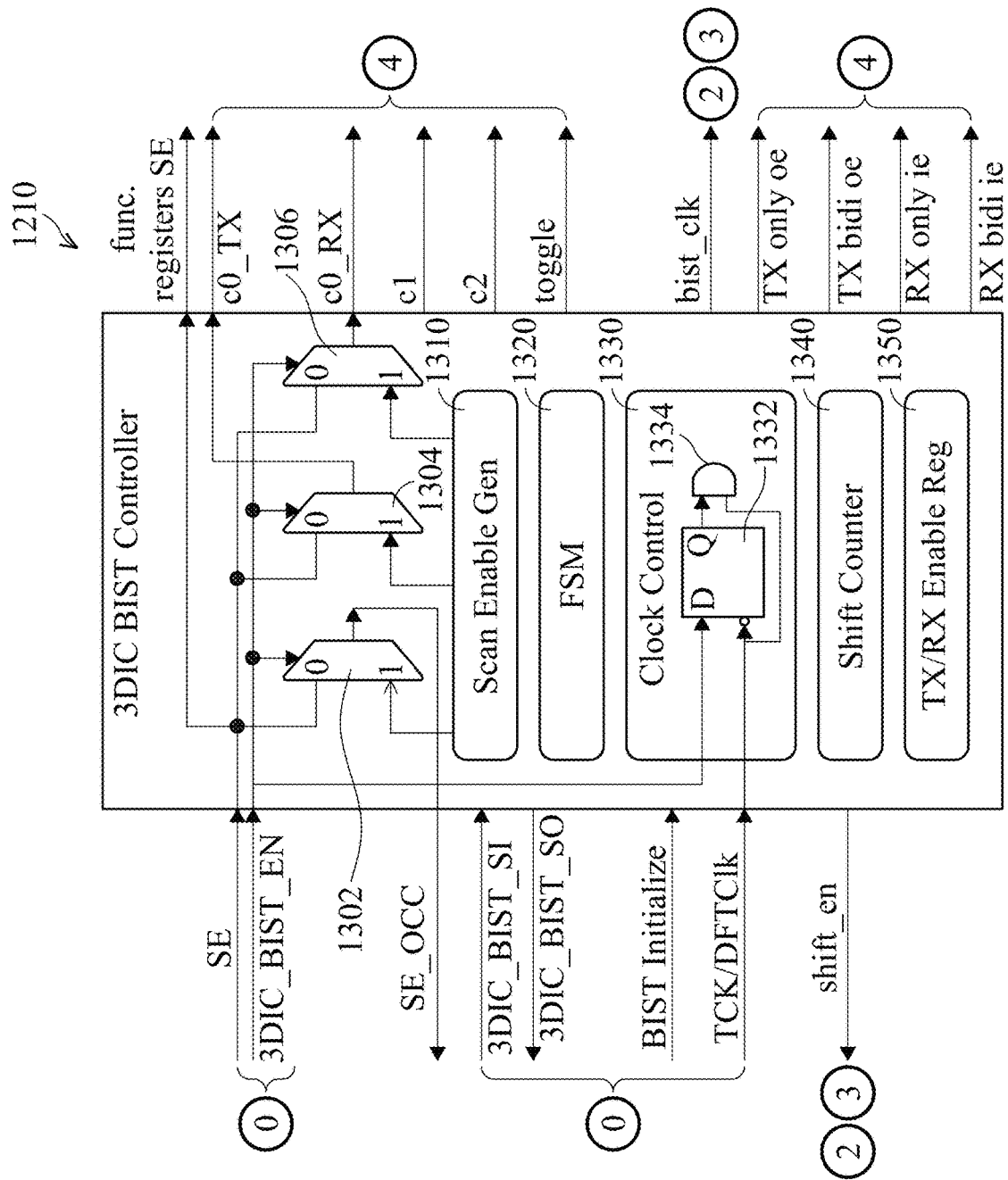
FIG. 13 is a block diagram illustrating an example 3D BIST controller in accordance with various embodiments of the present disclosure.

FIG. 13 is a block diagram illustrating an example 3D BIST controller 1300 (e.g., 3D BIST controller 1210) in accordance with various embodiments of the present disclosure. BIST controller 1300 uses initialization data (e.g., signal enable (SE) and 3DIC_BIST_EN signal) and assists with testing clocking for the on-chip clock controller (OCC), provides a scan enable for OCC, and generates control signals for multiplexers within the wrapper cells. Additionally, 3D BIST controller 1300 has scan input and scan output signals for testing the 3D BIST controller 1300 logic itself.

3D BIST controller 1300 includes multiplexers 1302, 1304, 1306, a scan enable signal generator 1310, a finite state machine (FSM) 1320, a clock controller 1330, a shift counter 1340, and a TX/RX enable register 1350. Multiplexers 1302, 1304, 1306 each receive scan enable signals generated by the scan enable generator 1310 as well as a scan enable (SE) input to 3D BIST controller 1300. Each multiplexer 1302, 1304, 1306 is also controlled by a 3D IC BIST enable signal (e.g., 3DIC_BIST_EN). Based on the logic sign of the 3D IC BIST enable signal, the multiplexers 1302, 1304, 1036 output the control signals (e.g., c0_TX, c0_RX, c1 and c2) for the multiplexers (e.g., multiplexers 304, 306, 308) of the wrapper cells (e.g., wrapper cell 300) as well as a scan enable signal for the OCC (e.g., SE_OCC). The control signals are provided to the chain of wrapper cells 1240 (e.g., chain 130, 140). The chain of wrapper cells 1240 also receive a toggle (TG) signal generated by the FSM 1320 of the 3D BIST controller 1300.

Clock controller 1330 includes a data register 1332 and a logic gate 1334. Clock controller 1330 receives an input clock (TCK/DFTClk) signal from the IC clock as well as the 3D IC BIST enable signal (e.g., 3DIC_BIST_EN). The data register 1332 takes these two signals and outputs data to the logic gate 1334. By way of example, logic gate 1334 is illustrated as a AND gate, but it is recognized that any combination of logic functions that provide a similar logic function as an AND gate can be used. The clock controller 1330 generates a BIST clock signal (e.g., bist_clk) that is provided to pattern generator 1220 and response compactor 1230.

Shift counter 1340 and TX/RX enable register 1350 generate the various input and output enable signals (e.g., TX only oe, TX bidi oe, RX only ie, RX bidi ie) for the IO pad (e.g., IO pad 312, 720, 730). These input and output enable signals are provided by the 3D BIST controller 1300 to the chain of wrapper cells 1240. The 3D BIST controller 1300 also receives scan input (e.g., 3D_BIST_SI) and scan output (e.g., 3D_BIST_SO) signals for testing the logic within the 3D BIST controller 1300.

Figure 14:
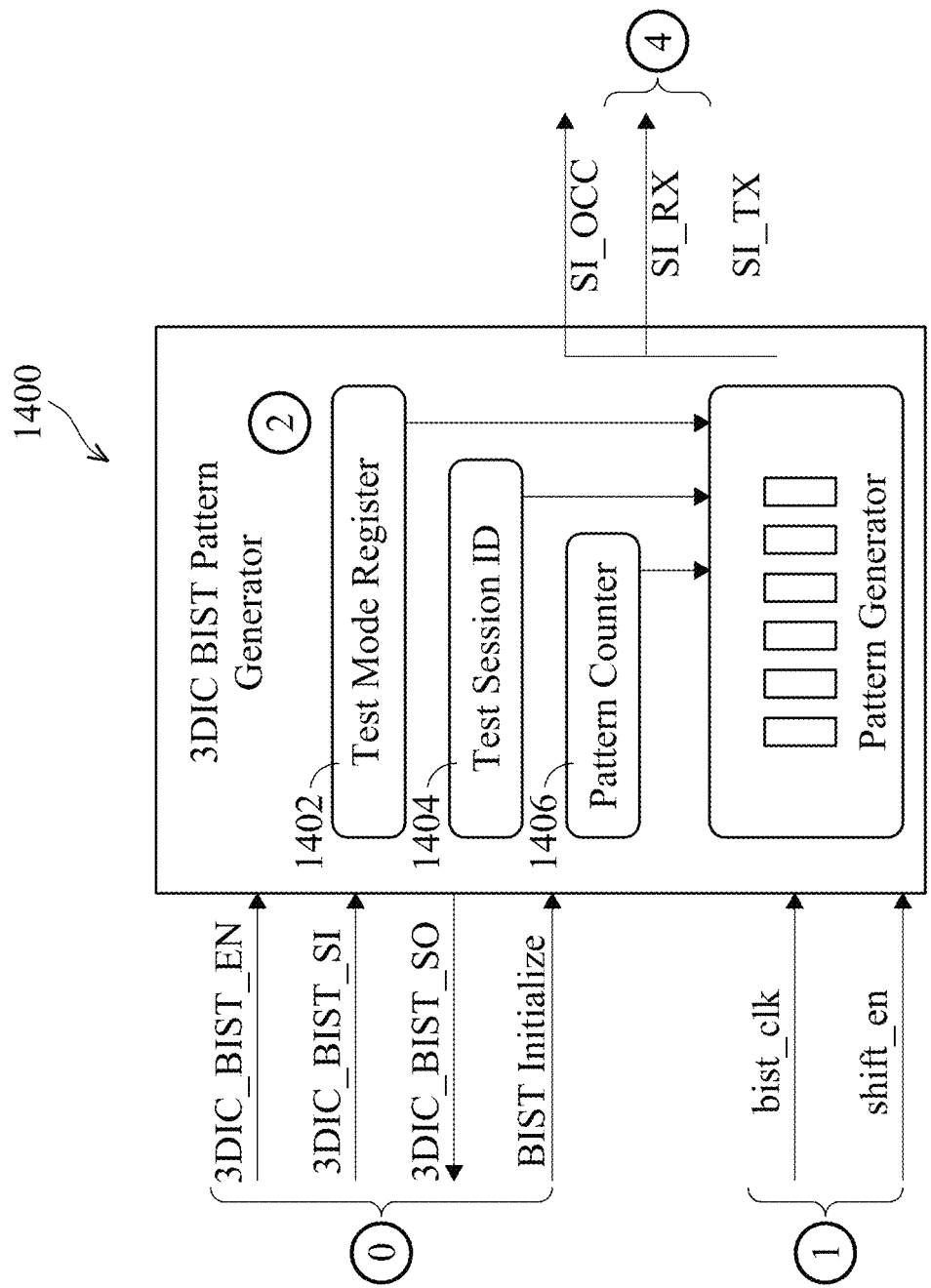
FIG. 14 is a block diagram illustrating an example pattern generator in accordance with various embodiments of the present disclosure.

FIG. 14 is a block diagram illustrating an example pattern generator 1400 (e.g., pattern generator 1220) in accordance with various embodiments of the present disclosure. Pattern generator 1400 uses initialization data (e.g., BIST_Initialize) and the inputs (e.g., bist_clk, shift_en) from the BIST controller 1300 to perform its functions. Such functions include setting up inter or intra-die test mode, setting up the right test session, generating predefined sequences for the corresponding test session (e.g., SI_OCC, SI_TX, SI_RX), and/or supplying patterns to the data registers (e.g., data registers 310, 1332). More specifically, pattern generator 1400 includes a test mode register 1402, a test session identification (ID) 1404, and a pattern counter 1406. The pattern generator generates the various patterns described in table 1100 of FIG. 11 such as the patterns for the DC test 1106, the AC test 1108, the bridging test 1112, and the leakage test 1110. These patterns are provided to the chain of wrapper cells 1240. The pattern generator 1400 also receives scan input (e.g., 3D_BIST_SI) and scan output (e.g., 3D_BIST_SO) signals for testing the logic within the pattern generator 1400.

Figure 15:
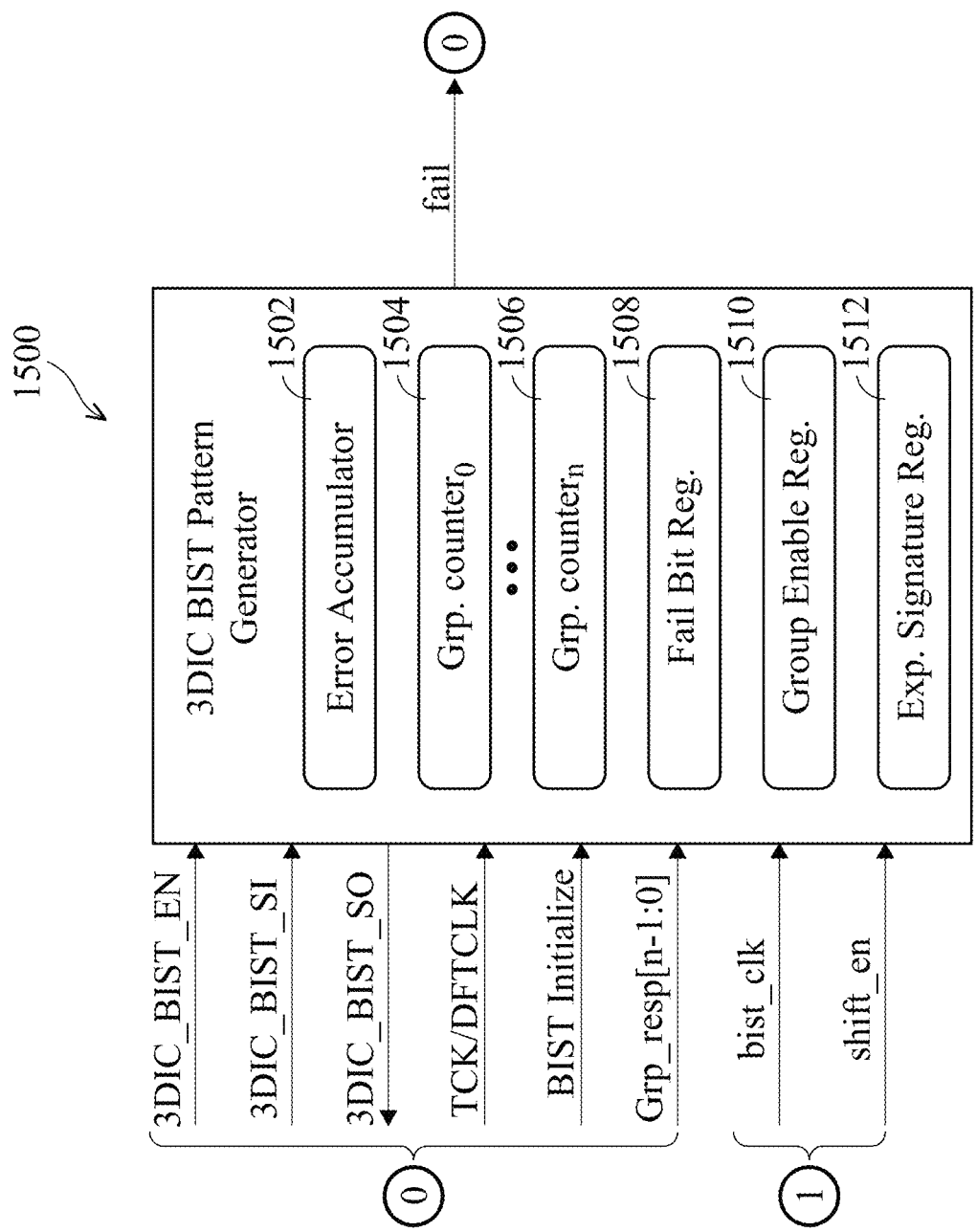
FIG. 15 is a block diagram illustrating another example pattern generator in accordance with various embodiments of the present disclosure.

FIG. 15 is a block diagram illustrating another example pattern generator 1500 (e.g., pattern generators 1220, 1400) in accordance with various embodiments of the present disclosure. Pattern generator performs the same functions, receives the same input signals, and generates the same output signals as previously described in relation to pattern generator 1400 of FIG. 14. Pattern generator 1500 includes a fail bit register 1508, a group enable register 1510, and an expected signature register 1512. Fail bit register 1508, group enable register 1510, and expected signature register 1512 together form the test mode register 1402 of FIG. 14. Pattern generator 1500 also includes error accumulator 1502 and a series of group counters 1504, 1506 that together form pattern counter 1406. If the pattern generator 1500 is unable to generate a test pattern for any reason, it outputs a fail signal.

Figure 16:
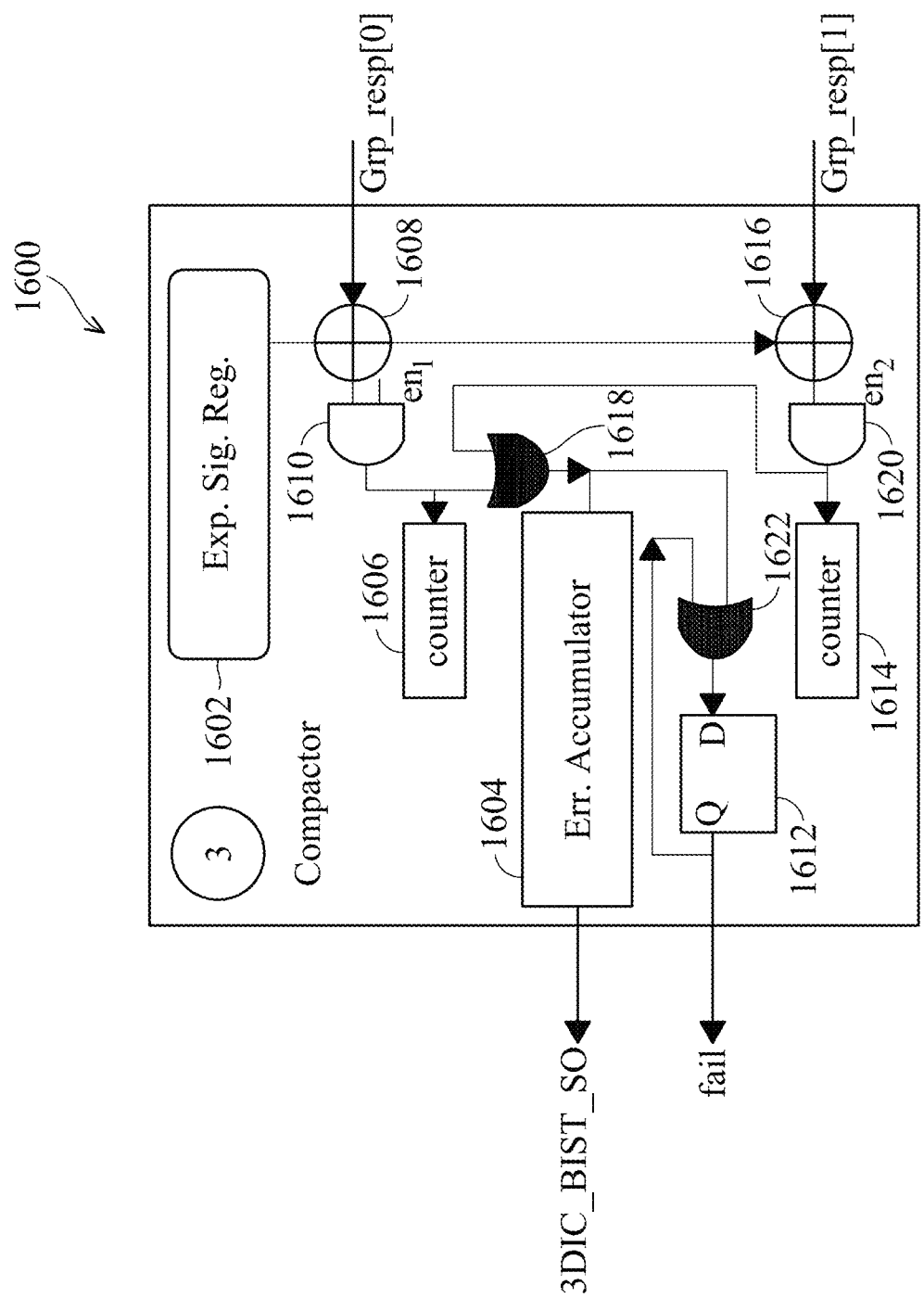
FIG. 16 is a block diagram of an example response compactor in accordance with various embodiments of the present disclosure.

FIG. 16 is a block diagram of an example response compactor 1600 (e.g., response compactor 1330) in accordance with various embodiments of the present disclosure. Response compactor 1600 includes an expected signature register 1602, adders 1608, 1616, logic gates 1610, 1618, 1620, 1622, counters 1606, 1614, data register 1612, and error accumulator 1604. Response compactor 1600 uses data and inputs from the BIST controller 1300 to perform its functions. These functions include collecting the failure count for each group of TX/RX registers in counters 1606, 1614, computing the error signature across all TX/RX groups using the error accumulator 1604 and providing a fail status, and debugging each TX/RX group individually with full diagnosis. The response compactor 1600 also receives scan input (e.g., 3D_BIST_SI) and scan output (e.g., 3D_BIST_SO) signals for testing the logic within the response compactor 1600.

Expected signature register 1602 contains an expected signature that is used to compare with the responses from the wrapper cells. Error accumulator 1604 counts total failures per group as well as collects error signatures across all groups. This is done using a combination of logic gates 1610, 1618, 1620, 1622 and adders 1608, 1616. More specifically, adder 1608 receives a group response signal (e.g., Grp_resp[0]) provided by group counter 1504 of pattern generator 1500. An output of adder 1608 is provided to logic gate 1610, which also receives a first enable signal (e.g., en1). By way of example, logic gate 1610 is illustrated as an AND gate, but it can be any combination of logic gates that perform the same function (e.g., output a logic high when both inputs are matching). An output of logic gate 1610 is provided to counter 1606 (which in turn increases a count) and logic gate 1618. Similarly, adder 1616 receives a group response signal (e.g., Grp_resp[1]) provided by group counter 1506 of pattern generator 1500. An output of adder 1616 is provided to logic gate 1620, which also receives an enable signal (e.g., en2). By way of example, logic gate 1620 is illustrated as an AND gate, but it can be any combination of logic gates that perform the same function (e.g., output a logic high when both inputs are matching). An output of logic gate 1620 is provided to counter 1614 (which in turn increases a count) and logic gate 1618. Logic gate 1618 compares the outputs of logic gates 1610, 1620. By way of example, logic gate 1618 is illustrated as an OR gate, but it can be any combination of logic gates that perform the same function (e.g., output a logic high when both inputs differ or when both inputs are logic highs '1'). The output of logic gate 1618 is provided to error accumulator 1604.

Data register 1612 reports a test failure at the first mismatch. Data register 1612 does this based on an output of logic gate 1622. Logic gate 1622 considers an output of data register 1612 (via a feedback loop) as well as the output of logic gate 1618.

Figure 17:
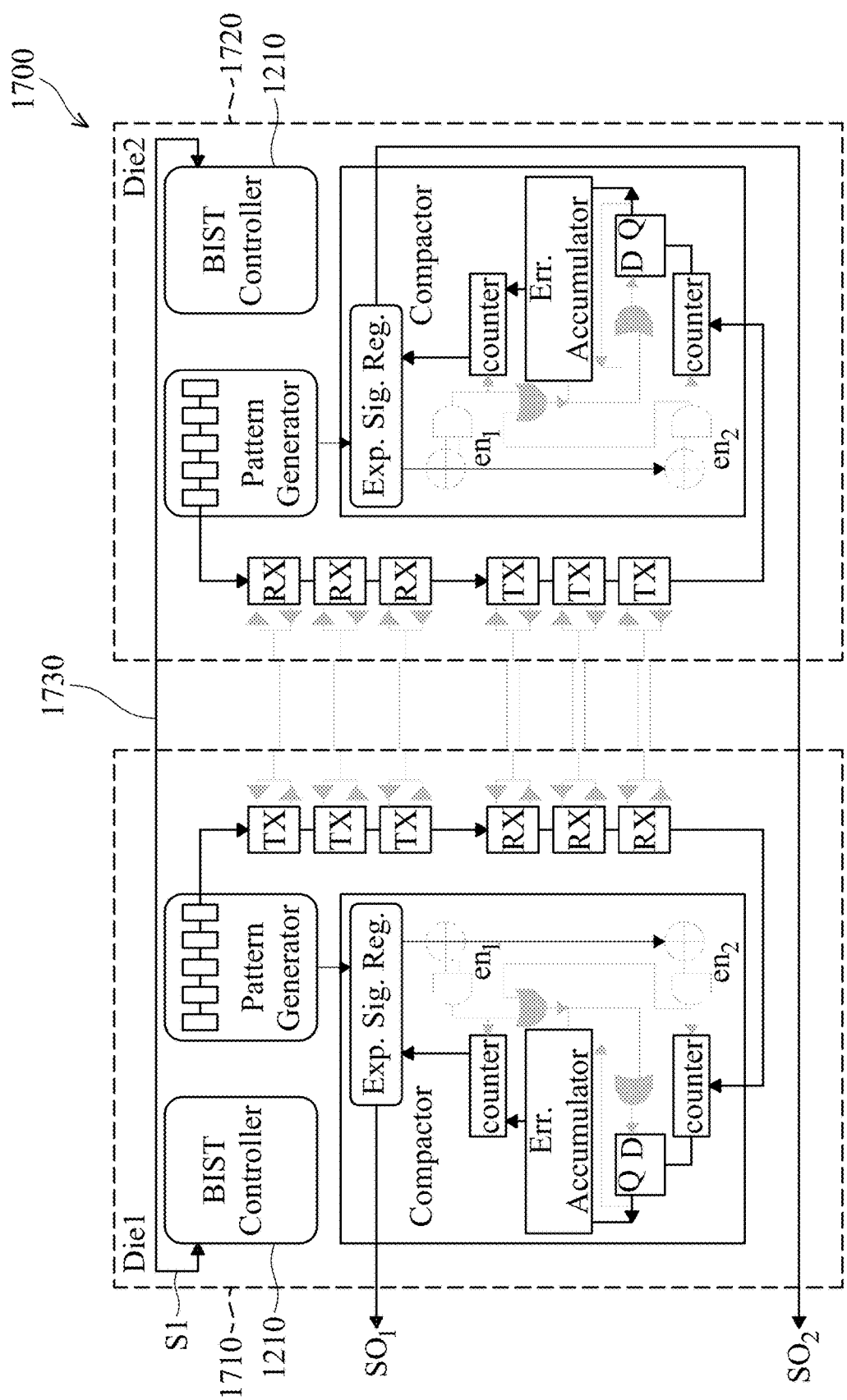
FIG. 17 is a block diagram illustrating an interconnected die system having two dies undergoing a zone 1 test in scan mode in accordance with various embodiments of the present disclosure.

FIG. 17 is a block diagram illustrating an interconnected die system 1700 having two dies 1710, 1720 undergoing a zone 1 test in scan mode in accordance with various embodiments of the present disclosure. Each die 1710, 1720 having components and functionality as die 1200 described in FIG. 12. With the zone 1 test, the scan input (SI) signal is provided external automatic test equipment (ATE). In the interconnected die system 1700, all the TX and RX registers are stitched into scan chains. All the flops in the self test logic, signature register, counters and error accumulator are also stitched in the scan chains. Each die 1710, 1720 has its own set of scan chains and is tested by itself. If a scan mode fails, then the level of chain that is defective can be detected. The scan test can be run in parallel or serially based on scan in and scan out ports available. The BIST controllers 1210 of each die 1710, 1720 are coupled together.

Figure 18:
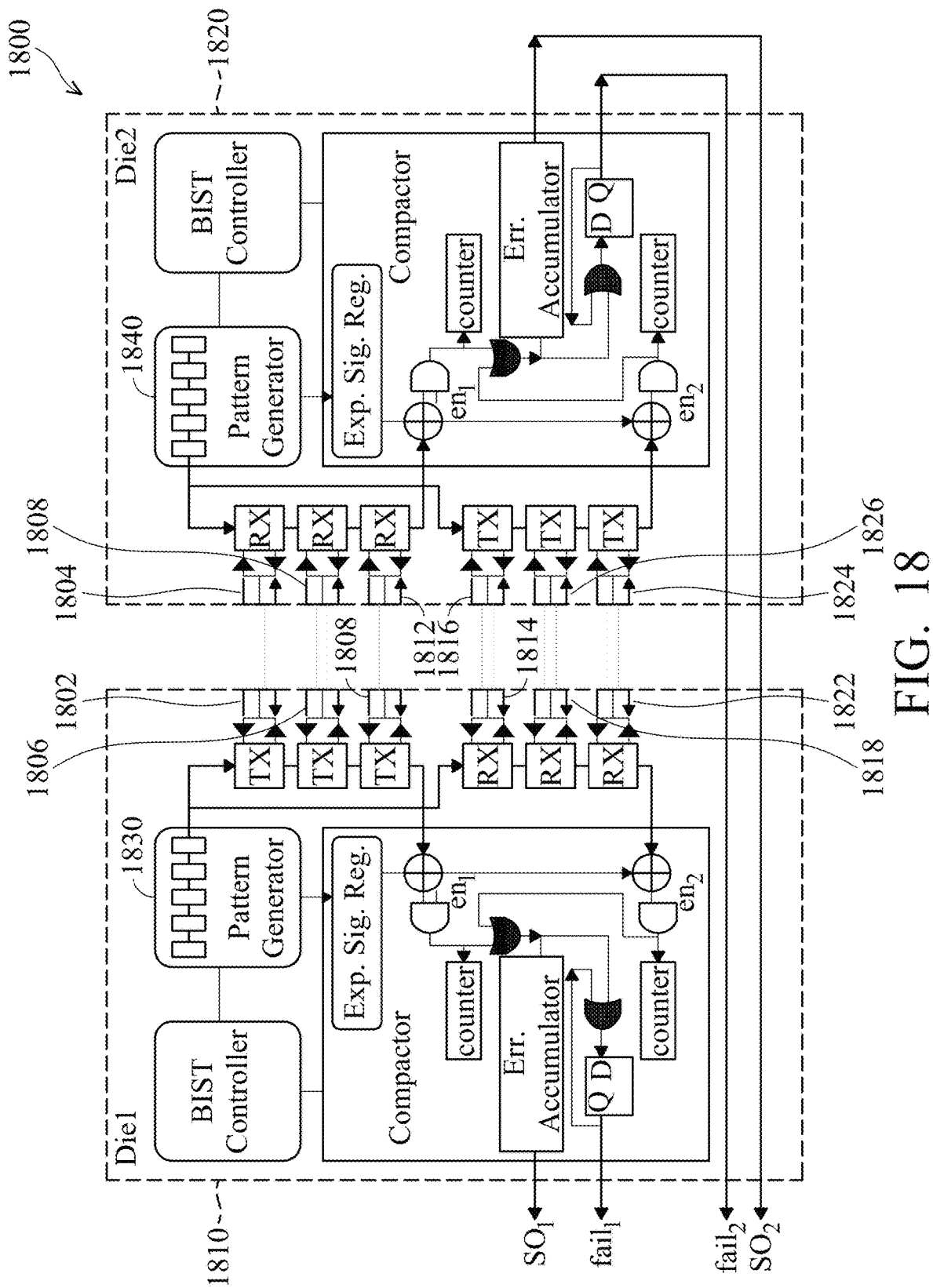
FIG. 18 is a block diagram illustrating an interconnected die system having two dies undergoing a zone 2 test in accordance with various embodiments of the present disclosure.

FIG. 18 is a block diagram illustrating an interconnected die system 1800 having two dies 1810, 1820 undergoing a zone 2 test in accordance with various embodiments of the present disclosure. Each die 1810, 1820 TX/RX wrapper cell interface 1802, 1804, 1806, 1808, 1810, 1812, 1814, 1816,

1818, 1822, 1824, 1826 is tested separately. With the zone 2 test of dies 1810, 1820, inputs for the TX and RX wrapper cells are from the pattern generator in each die. In other words, the inputs for the TX and RX wrapper cells of die 1810 are generated by pattern generator 1830. The inputs for the TX and RX wrapper cells of die 1820 are generated by pattern generator 1840. During the zone 2 test, the wrapper cells IO pads are disabled during shift and put into the loop back during capture. The TX and RX scan chains receive test pattern from the BIST engine in the respective die. The responses captured from each TX and RX wrapper cell are processed by the response compactor in each respective die.

Figure 19:
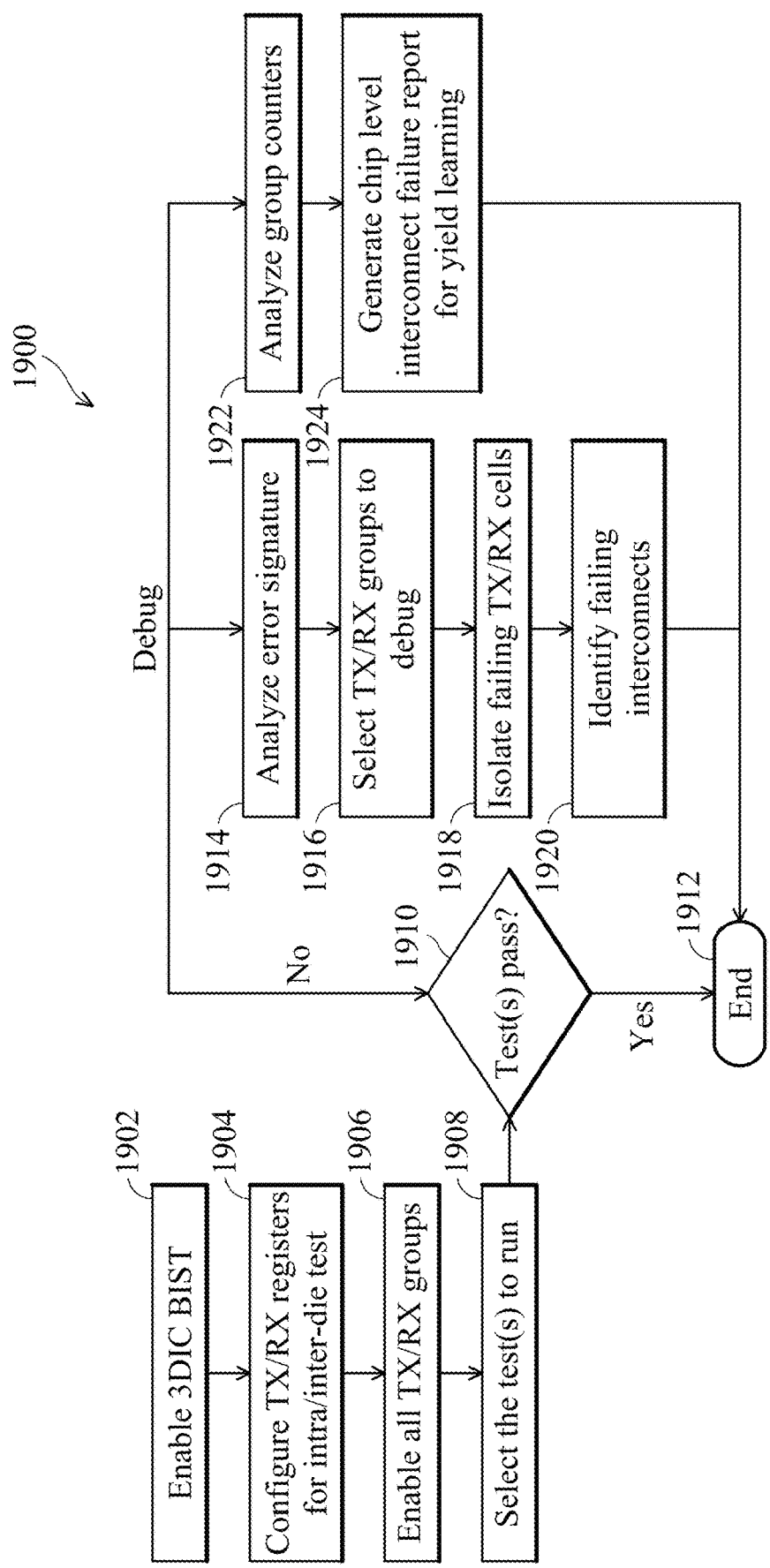
FIG. 19 is a process flow chart illustrating testing and debugging of a 3D IC in accordance with various embodiments of the present disclosure.

FIG. 19 is a process flow chart 1900 illustrating testing and debugging of a 3D IC in accordance with various embodiments of the present disclosure. At step 1902, the BIST circuit is enabled for testing (e.g., via 3DIC_SE_B-IST). At step 1904, the data register 310 in each TX and RX wrapper cell are configured for the intra-die and/or inter-die tests based on the control signals (c0, c1, c2). At step 1906, each TX and RX wrapper cell is enabled for testing. At step 1908, one or more tests from table 1100 are selected for running on the 3D IC. At step 1910, it is determined whether the test(s) passed. If the test(s) passed, then the testing and debugging ends at step 1912. If however, one or more test(s) failed, then debugging of the 3D IC commences. In one variation of debugging, at step 1914, an error signature is compared against the expected signature stored in the expected signature register 1602. At step 1916, select TX or RX wrapper cells can be identified for further debugging based on the error signature not matching the expected error signature. At step 1918, failing TX or RX wrapper cells are isolated. At step 1920, any failing interconnects associated with those failing TX or RX wrapper cells are identified. Steps 1914, 196, 1918, and 1920 can occur simultaneously or serially with steps 1922, 1924. At step 1922, the group counters (e.g., group counters 1504, 1506) are analyzed. At step 1924, a chip level interconnect failure report for yield learning is generated.

Figure 20:
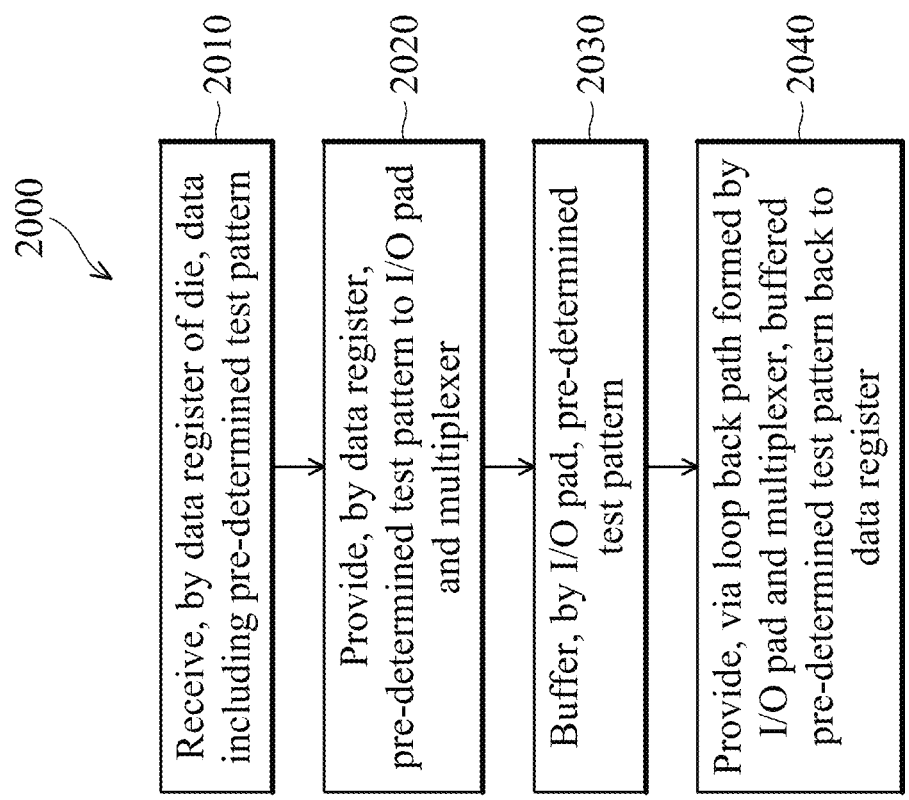
FIG. 20 is a process flow diagram illustrating method of testing die functionality using a loop back path in accordance with various embodiments of the present disclosure.

FIG. 20 is a process flow diagram 2000 illustrating method of testing die functionality using a loop back path in accordance with various embodiments of the present disclosure. While FIG. 20 is described here with reference to previously described structures for ease in understanding, it is understood that the method applies to many other structures as well. At step 2010, a data register (e.g., data register 310) of a die receives data including a pre-determined test pattern (e.g., data D). At step 2020, the data register (e.g., data register 310) provides the pre-determined test pattern (e.g., FO/TO) to an I/O pad (e.g., I/O pad 312) and a multiplexer (e.g., multiplexer 308). At step 2030, the I/O pad (e.g., I/O pad 312) buffers the pre-determined test pattern. At step 2040, via loop back path formed by the I/O pad (e.g., I/O pad 312) and the multiplexer (e.g., multiplexer 308) provides the buffered pre-determined test pattern back to the data register (e.g., data register 310).

Use of the various systems, circuits, and methods as described herein can provide a number of advantages. For example, the systems, circuits, and methods described herein provide an ability to test a 3D IC design in a modular fashion of die interfaces as well as die-to-die interconnects. Additionally, use of the systems, circuits, and methods described herein provide an ability to detect any pair of failing transmit/receive (TX/RX) pair using the BIST engine.

In a first embodiment, a wrapper cell of an integrated circuit includes a data register, an I/O pad, and a first multiplexer. The data register is configured to output a signal. The I/O pad is coupled to the data register. The I/O pad is configured to receive and buffer the signal. The first multiplexer is coupled to the I/O pad and the data register. The first multiplexer is configured to selectively output either the buffered signal or the signal based on whether a scan mode or a functional mode is enabled.

In another embodiment, an integrated circuit with BIST functionality includes a first die and a second die. The first die includes a first wrapper cell with a first multiplexer, a first data register, and a first I/O pad. The second die includes a second wrapper cell with a second multiplexer, a second data register, and a second I/O pad. The first die is coupled to the second die via an inter-die interconnection. The first wrapper cell is configured to perform a first intra-die test that tests functionality of the first multiplexer, the first data register, or the first I/O pad in an intra-die test mode. The second wrapper cell is configured to perform a second intra-die test that tests the functionality of the second multiplexer, the second data register, or the second I/O pad in the intra-die test mode.

In yet another embodiment, a method of testing one or more dies using built-in self-test (BIST) functionality includes receiving, by a data register of a die, data comprising a pre-determined test pattern. The data register outputs the pre-determined test pattern to an I/O pad and a multiplexer. The I/O pad buffers the pre-determined test pattern. A loop back path formed by the I/O pad and the multiplexer provides the buffered pre-determined test pattern back to the data register.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cell of an integrated circuit, the cell comprising:
    a data register configured to output a signal;
    an I/O pad coupled to the data register, wherein the I/O pad is configured to receive and buffer the signal;
    a first multiplexer coupled to the I/O pad and the data register, the first multiplexer configured to selectively output either the buffered signal or the signal based on whether a scan mode or a functional mode is enabled; and
    a logic gate coupled to an output from the first multiplexer, the logic gate configured to either toggle data or hold data provided to the data register.

2. The cell of claim 1, wherein a loop back path comprises the I/O pad and the first multiplexer, the loop back path configured to direct the buffered signal back to the data register through the first multiplexer.

3. The cell of claim 2, wherein when scan mode is enabled, the buffered signal is directed back to the data register and the signal output by the data register is a test pattern signal.

4. The cell of claim 3, wherein the test pattern signal is provided by a pattern generator configured to generate the test pattern signal based on a specific test being executed for the integrated circuit.

5. The cell of claim 1, further comprising:
a second multiplexer coupled to an input of the data register, the second multiplexer configured to enable either the scan mode or the functional mode based on a control signal driving the second multiplexer;
a third multiplexer coupled to an input of the second multiplexer, the third multiplexer configured to enable either a scan in signal or a loop back signal to be provided to the second multiplexer; and
the logic gate coupled to an input of the third multiplexer, the logic gate configured to either toggle data or hold data provided to the data register via the second multiplexer and the third multiplexer.

6. The cell of claim 5, wherein the control signal is generated by a plurality of multiplexers of a built-in self-test (BIST) controller.

7. The cell of claim 1, wherein the I/O pad comprises a first buffer and a second buffer collectively configured to buffer the signal.

8. The cell of claim 1, wherein the I/O pad comprises a buffer configured to buffer the signal.

9. An integrated circuit with built-in self-test (BIST) functionality, the integrated circuit comprising
a first die comprising a first cell comprising a first multiplexer, a first data register, and a first input/output (I/O) pad; and
a second die comprising a second cell comprising a second multiplexer, a second data register, and a second I/O pad,
wherein the first die is coupled to the second die via an inter-die interconnection and wherein the first cell is configured to perform a first intra-die test that tests functionality of the first multiplexer, the first data register, or the first I/O pad in an intra-die test mode and the second cell is configured to perform a second intra-die test that tests the functionality of the second multiplexer, the second data register, or the second I/O pad in the intra-die test mode.

10. The integrated circuit of claim 9, wherein in an inter-die test mode, the first data register outputs a test pattern to the first I/O pad, and the first I/O pad forwards the test pattern to the second I/O pad, wherein the second I/O pad directs the test pattern to the second data register through a scan-in path of the second die.

11. The integrated circuit of claim 10, wherein a first loop back path comprises the first I/O pad and the first multiplexer and a second loop back path comprises the second I/O pad and the second multiplexer, and wherein a buffered test pattern is provided to the first data register and the second data register via the first multiplexer and the second multiplexer in a scan mode.

12. The integrated circuit of claim 9, wherein the first die further comprises:
a first BIST controller configured to initiate an intra-die test of logic functionality of the first die, an inter-die test of logic functionality of an interface between the first die and the second die, or a stack-level test of logic functionality of both the first die and the second die;
a first pattern generator configured to generate pre-determined test patterns for the first data register; and
a first response compactor configured to receive responses to the pre-determined test patterns from the first cell and generate data for analyzing yield and fault diagnosis of the first die or the second die.

13. The integrated circuit of claim 12, wherein the first BIST controller comprises a plurality of multiplexers that generate a control signal that controls the first multiplexer.

14. The integrated circuit of claim 9, wherein the second die further comprises:
a second BIST controller configured to initiate an intra-die test of logic functionality of the second die, an inter-die test of logic functionality of an interface between the first die and the second die, or a stack-level test of logic functionality of both the first die and the second die;
a second pattern generator configured to generate pre-determined test patterns for the second data register;
a second response compactor configured to receive responses to the pre-determined test patterns from the second cell and generate data for analyzing yield and fault diagnosis of the first die or the second die.

15. The integrated circuit of claim 14, wherein the second BIST controller comprises a plurality of multiplexers that generate a control signal that controls the second multiplexer.

16. The integrated circuit of claim 9, wherein the first cell is further configured to perform an inter-die test, the inter-die test comprising at least one of a chain test that tests a chain shift of the first cell and a third cell of the first die, a direct current (DC) test that tests for shorts or opens in at least one of the first multiplexer, the second multiplexer, the first I/O pad, the second I/O pad, the first data register, or the second data register, an alternating current (AC) test that tests for timing failures in at least one of the first multiplexer, the second multiplexer, the first I/O pad, the second I/O pad, the first data register, or the second data register, a leakage test that tests for cell leakage failures within the first die, a bridging test that tests inter-wire bridges between the first die and the second die, or a burn-in test that tests for burn-in failures of the first die or the second die.

17. The integrated circuit of claim 9, wherein the first I/O pad comprises a first buffer and a second buffer collectively configured to buffer a pre-determined test signal, and wherein the second I/O pad comprises a third buffer and a fourth buffer collectively configured to buffer the pre-determined test signal.

18. The integrated circuit of claim 9, wherein the first I/O pad comprises a first buffer configured to buffer a pre-determined test signal, and wherein the second I/O pad comprises a second buffer configured to buffer the pre-determined test signal.

19. The integrated circuit of claim 9, wherein the inter-die interconnection is a physical wire connection between the first die and the second die.

20. A method of testing one or more dies using built-in self-test (BIST) functionality, the method comprising:
receiving, by a data register of a die, data comprising a pre-determined test pattern;
providing, by the data register, the pre-determined test pattern to an I/O pad and a multiplexer;
buffering, by the I/O pad, the pre-determined test pattern; and
providing, via a loop back path formed by the I/O pad and the multiplexer, the buffered pre-determined test pattern back to the data register via a logic gate.

* * * * *